(12) United States Patent
Birang et al.

(10) Patent No.: US 7,837,851 B2
(45) Date of Patent: Nov. 23, 2010

(54) IN-SITU PROFILE MEASUREMENT IN AN ELECTROPLATING PROCESS

(75) Inventors: Manoocher Birang, Los Gatos, CA (US); Nicolay Y. Kovarsky, Sunnyvale, CA (US); Bernardo Donoso, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 1576 days.

(21) Appl. No.: 11/137,711

(22) Filed: May 25, 2005

(65) Prior Publication Data

US 2006/0266653 A1 Nov. 30, 2006

(51) Int. Cl.
C25D 21/12 (2006.01)

(52) U.S. Cl. .................. 205/83; 205/82; 205/96; 205/123

(58) Field of Classification Search .......... 205/83
See application file for complete search history.

(56) References Cited

U.S. PATENT DOCUMENTS

| | | | |
|---|---|---|---|
| 2,689,216 A | 9/1954 | Nevers et al. | |
| 3,915,834 A | 10/1975 | Wright et al. | |
| 4,267,024 A | 5/1981 | Weiskopf | |
| 4,279,707 A * | 7/1981 | Anderson et al. | 205/148 |
| 4,534,832 A | 8/1985 | Doiron, Jr. | |
| 4,828,654 A | 5/1989 | Reed | |
| 5,156,730 A | 10/1992 | Bhatt et al. | |
| 5,256,274 A | 10/1993 | Poris | |
| 5,298,280 A | 3/1994 | Kaczur et al. | |
| 5,368,702 A * | 11/1994 | de Nora | 205/373 |
| 5,443,707 A | 8/1995 | Mori | |
| 5,498,325 A | 3/1996 | Nishimura et al. | |
| 6,093,291 A | 7/2000 | Izumi et al. | |
| 6,110,346 A | 8/2000 | Reid et al. | |
| 6,126,798 A | 10/2000 | Reid et al. | |
| 6,187,164 B1 | 2/2001 | Warren et al. | |
| 6,210,554 B1 | 4/2001 | Kosaki et al. | |
| 6,261,433 B1 | 7/2001 | Landau | |
| 6,551,483 B1 | 4/2003 | Mayer et al. | |
| 6,562,204 B1 | 5/2003 | Mayer et al. | |
| 6,587,118 B1 | 7/2003 | Yoneda | |
| 6,793,792 B2 * | 9/2004 | Jones et al. | 205/83 |
| 6,830,673 B2 | 12/2004 | Yahalom et al. | |
| 6,866,763 B2 * | 3/2005 | Basol et al. | 205/84 |

(Continued)

FOREIGN PATENT DOCUMENTS

GB 2102836 12/1983

(Continued)

OTHER PUBLICATIONS

F. A. Lowenheim, Electroplating, McGraw-Hill Book Company, New York, 1978, pp. 12-24.*

(Continued)

*Primary Examiner*—Patrick Ryan
*Assistant Examiner*—William T Leader
(74) *Attorney, Agent, or Firm*—Patterson & Sheridan

(57) ABSTRACT

A method and apparatus for measuring differential voltages in an electrolyte of an electrochemical plating cell. Current densities are calculated from the measured differential voltages and correlated to thickness values of plated materials. A real time thickness profile may be generated from the thickness values.

31 Claims, 19 Drawing Sheets

U.S. PATENT DOCUMENTS

| | | | |
|---|---|---|---|
| 7,160,421 B2 * | 1/2007 | Wilson et al. | 204/229.4 |
| 7,279,084 B2 * | 10/2007 | Chalupa et al. | 205/81 |
| 7,368,042 B2 * | 5/2008 | Hsu et al. | 204/228.1 |
| 2003/0000604 A1 | 1/2003 | Bishop et al. | |
| 2003/0201770 A1 | 10/2003 | Hanawa et al. | |
| 2004/0084316 A1 * | 5/2004 | Muranaka | 205/84 |
| 2004/0192066 A1 | 9/2004 | Lumomirsky et al. | |
| 2004/0256222 A1 * | 12/2004 | Griego et al. | 204/280 |

FOREIGN PATENT DOCUMENTS

| | | |
|---|---|---|
| SU | 968104 | 10/1982 |
| WO | WO 99/25902 | 5/1999 |
| WO | WO 99/25903 | 5/1999 |
| WO | WO 99/41434 | 8/1999 |

OTHER PUBLICATIONS

A. Kenneth Graham, editor, Electroplating Engineering Handbook, Reinhold Publishing Corporation, New York, 1962, pp. 480-490.*

U.S. Appl. No. 09/586,736 entitled "Programmable Anode Apparatus and Associated Method", filed Jun. 5, 2000.

* cited by examiner

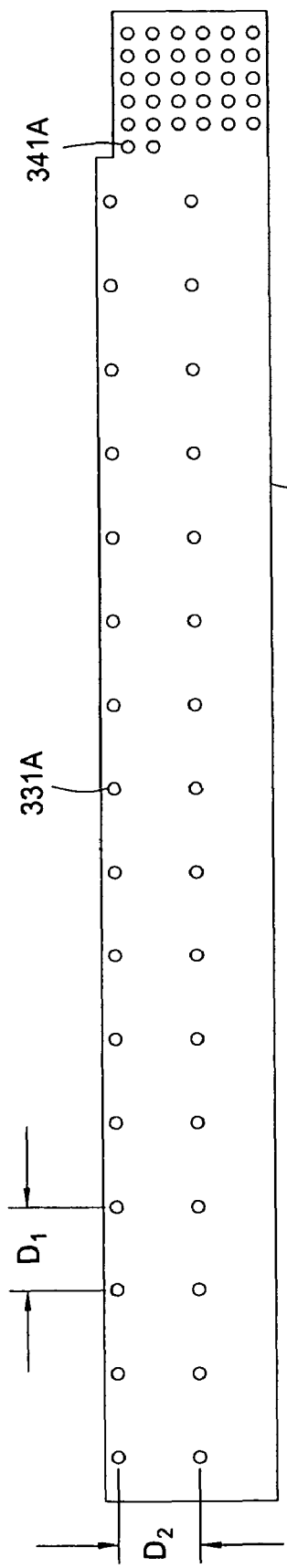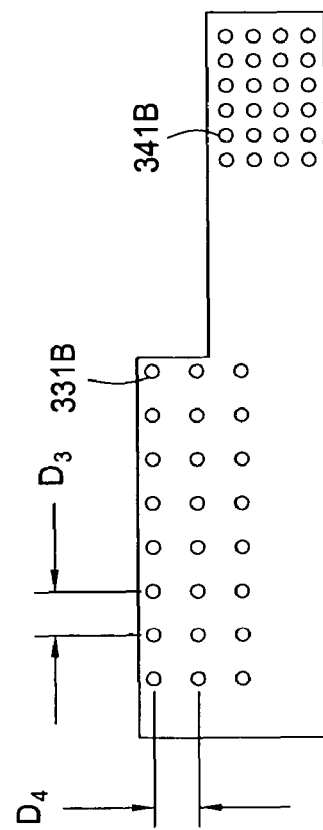
FIG. 3A
FIG. 3B

IN-SITU PROFILE MEASUREMENT IN AN ELECTROPLATING PROCESS

BACKGROUND OF THE INVENTION

1. Field of the Invention

Embodiments of the invention generally relate to measuring spatial plating cell current distribution represented by measuring the differential voltages inside an electrochemical plating cell in-Situ.

2. Description of the Related Art

In semiconductor processing, electrochemical plating (ECP) is generally the preferred technique for filling features formed onto substrates with a conductive material. A typical ECP process generally includes immersing a substrate into an electrolyte solution that is rich in ions of the conductive material (generally copper), and then applying an electrical bias between a conductive seed layer formed on the surface of the substrate and an anode positioned in the electrolyte solution. The application of the electrical bias between the seed layer and the anode facilitates an electrochemical reaction that causes the ions of the conductive material to plate onto the seed layer.

However, with conventional ECP processes and systems, the conductive seed layer formed on the substrate is generally very thin, and as such, is highly resistive. The resistive characteristics of the seed layer causes the electric field traveling between the anode and the seed layer in a plating process to be much more dense near the perimeter of the substrate where electrical contact with the seed layer is generally made. This increased electric field density near the perimeter of the substrate causes the plating rate near the perimeter of the substrate to increase proportionally. This phenomenon is generally known as the "terminal effect", and is an undesirable characteristic associated with conventional plating systems.

The terminal effect is of particular concern to semiconductor processing, because as the size of features continues to decrease and aspect ratios continue to increase, the seed layer thickness will inherently continue to decrease. This decrease in the thickness of the seed layer will further increase the terminal effect, as the decreased thickness of the seed layer further increases the resistivity of the layer.

Another challenge in an electrochemical process is that features on some portions of a substrate may be undesirably filled or even filled up while immersing the substrate into a plating bath. During the immersion process, a forward or plating bias is generally applied to counteract etching of the seed layer on the substrate by the plating solution, which is generally an acidic solution. During this time period, which may be as little as 0.25 seconds, some features in certain region on the substrate may be filled which may result in poor uniformity and variable device yield performance.

Therefore, there is a need for an electrochemical plating cell and methods for plating onto conductive materials semiconductor substrates, wherein the plating thickness profile is monitored and controlled in real time.

SUMMARY OF THE INVENTION

Embodiments of the invention generally provide an electrochemical plating system having a sensor assembly disposed in an electrolyte and a control unit connected to the sensors.

Embodiments of the invention may further provide a method for measuring plating thickness profile in-situ during an electrochemical plating process. Spatial differential voltages in the plating bath are measured through an array of sensors disposed in the plating bath. A real time plating profile is then generated by integrating current values associated with the differential voltage values.

Embodiments of the invention may further provide a method and an apparatus for generating plating thickness profile in-situ during an electrochemical plating process. The method comprises measuring plating cell current distribution represented by differential voltages in the electrolyte and generating real time thickness profiles by integrating the electrical current values over time. Since the copper thickness is directly proportional to the integral electrical values over time.

Embodiments of the invention may further provide a method for producing a uniform profile on a substrate by electrochemical plating. The method generally comprises starting an electroplating on the wherein the substrate is in contact with an electrolyte; measuring a set of cell current distributions in the electrolyte; generating a real time thickness profile from the set of cell current distributions; and adjusting one or more process parameters according to the real time thickness profile.

Embodiments of the invention may further provide a method for producing a desired profile on a substrate by electroplating. The method generally comprises starting an electroplating on the wherein the substrate is in contact with an electrolyte; measuring a set of cell current distributions in the electrolyte; generating a real time thickness profile from the set of cell current distributions; comparing the real time thickness profile to the desired thickness profile to obtain an error profile; adjusting one or more process parameters according to the real time thickness profile; and terminating the electroplating process when the error profile is within a predetermined tolerance profile.

Embodiments of the invention may further provide a method for monitoring immersing a substrate into an electrolyte for electrochemical plating. The method generally comprises applying a bias voltage between the substrate and an anode assembly disposed in the electrolyte; immersing the substrate into the electrolyte; during immersing, monitoring cell current distributions of the electrolyte; determining immersing status from the cell current distributions; and adjusting the bias voltage corresponding to the immersing status.

The details of one or more implementations are set forth in the accompanying drawings and the description below. Other features and advantages of the invention will be apparent from the description and drawings.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

FIG. 3A illustrates an exemplary sensor assembly of the plating cell shown in FIG. 3.

FIG. 3B illustrates an exemplary sensor assembly of the plating cell shown in FIG. 3.

DETAILED DESCRIPTION OF THE PREFERRED EMBODIMENT

The present invention generally provides an electrochemical plating cell configured to plate a metal onto a semiconductor substrate. The plating cell of the invention generally includes a fluid volume cell, a contact ring, an anode and array of sensors disposed in the fluid volume. The array of sensors positioned in the fluid volume are configured to measure cell current distributions during plating. A thickness profile of plated metal can be generated from the cell current distributions using a method provided by the present invention.

Figure 1:
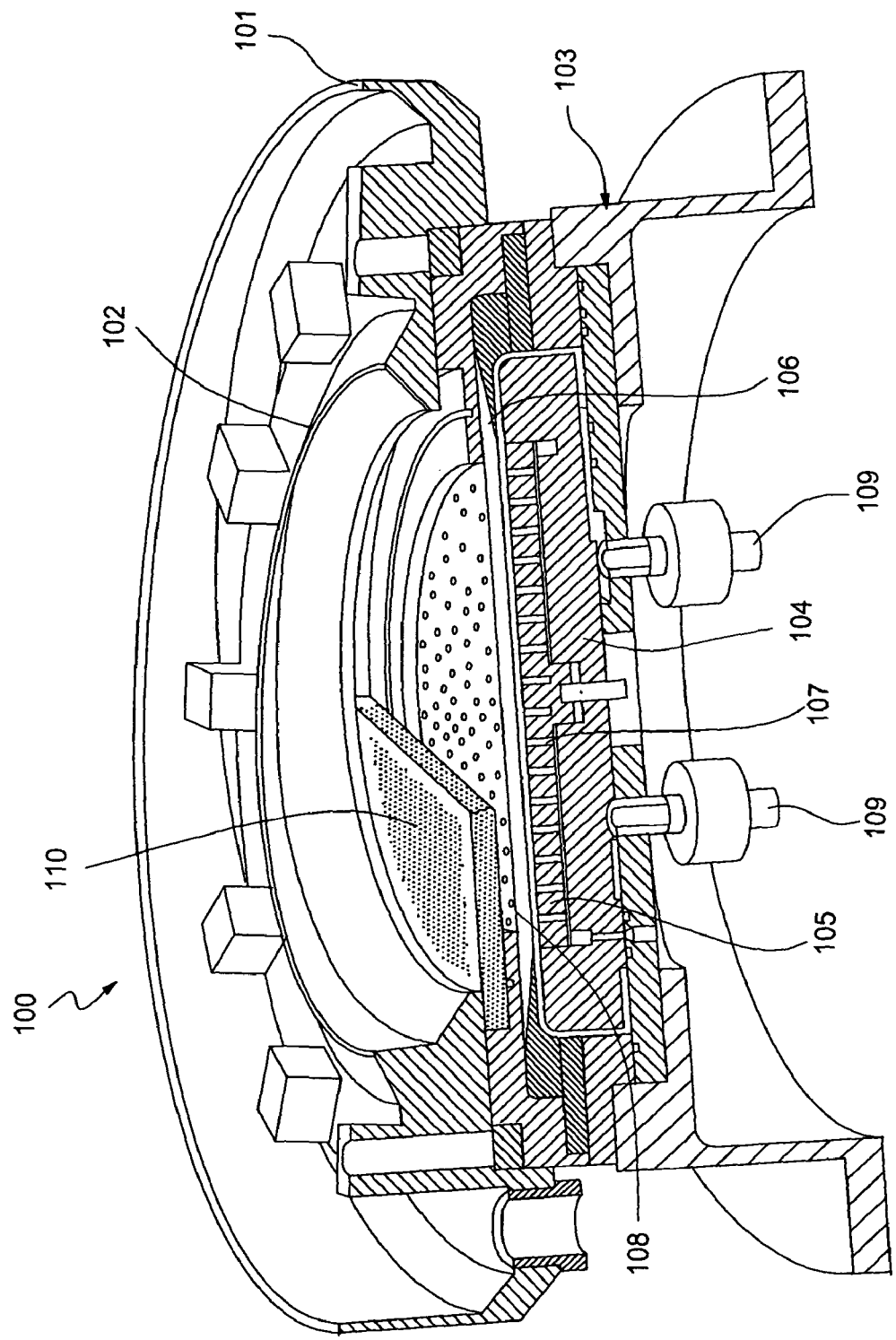
FIG. 1 illustrates a schematic view of an exemplary plating cell.

FIG. 1 illustrates a schematic view of an exemplary plating cell 100. The plating cell 100 generally includes an outer basin 101 and an inner basin 102 positioned within the outer basin 101. The inner basin 102 is generally configured to contain a plating solution that is used to plate a metal, e.g., copper, onto a substrate during an electrochemical plating process. During the plating process, the plating solution is generally continuously supplied to the inner basin 102 (e.g. 1 gallon per minute), and therefore, the plating solution continually overflows the uppermost point of the inner basin 102 (generally termed as "weir") and is collected by the outer basin 101. The solution collected by the outer basin 101 is then drained therefrom for recirculation and/or chemical management.

As illustrated in FIG. 1, plating cell 100 is generally positioned at a tilt angle, i.e., the frame portion 103 of plating cell 100 is generally elevated on one side such that components of the plating cell 100 are tilted between about 3° and about 30°. Therefore, in order to contain an adequate depth of plating solution within the inner basin 102 during plating operations, the uppermost portion of the inner basin 102 may be extended upward on one side of the plating cell 100, such that the uppermost point of the inner basin 102 is generally horizontal and allows contiguous overflow of the plating solution supplied thereto around the perimeter of the inner basin 102. However, embodiment of the present invention are not limited to tilted plating cells, as positioning the plating cell 100 at any angle with respect to horizontal, including 0°, for example, is contemplated within the scope of the invention.

The frame member 103 of the plating cell 100 generally includes an annular base member 104 secured to the frame member 103. Since the frame member 103 is elevated on one side, the upper surface of base member 104 is generally tilted from the horizontal at an angle that corresponds to the angle of the frame member 103 relative to a horizontal position. The base member 104 includes an annular or disk shaped recess formed therein, the annular recess being configured to receive a disk shaped anode member 105. The base member 104 further includes a plurality of fluid inlets/drains 109 positioned on a lower surface thereof. Each of the fluid inlets/drains 109 are generally configured to individually supply or drain a fluid to or from either the anode compartment or the cathode compartment of the plating cell 100. The anode member 105 generally includes a plurality of slots 107 formed therethrough, wherein the slots 107 are generally positioned in parallel orientation with each other across the surface of the anode 105. The parallel orientation allows for dense fluids generated at the anode surface to flow downwardly across the anode surface and into one of the slots 107.

The plating cell 100 further includes a membrane support assembly 106. Membrane support assembly 106 is generally secured at an outer periphery thereof to the base member 104, and includes an interior region configured to allow fluids to pass therethrough. A membrane 108 is stretched across the support 106 and generally operates to fluidly separate a catholyte chamber (positioned adjacent the substrate being plated) and an anolyte chamber (positioned adjacent the anode electrode in the cell). The membrane support assembly 106 may include an o-ring type seal positioned near a perimeter of the membrane 108, wherein the seal is configured to prevent fluids from traveling from one side of the membrane 108 secured on the membrane support 106 to the other side of the membrane 108. As such, the membrane 108 generally provides fluid isolation between the anode and cathode portions of the plating cell 100. Exemplary membranes that may be used to fluidly isolate an anolyte from a catholyte are illustrated in commonly assigned U.S. patent application Ser. No. 10/627,336 filed on Jul. 24, 2003 entitled "Electrochemical Processing Cell", which is hereby incorporated by reference in its entirety. Alternatively, the membrane 108 may be a fluid permeable filter-type membrane that allows fluid to pass therethrough. In one aspect, no membrane or filter type membrane is used in the plating cell to reduce the plating cell cost and complexity.

A diffusion plate 110, which is generally a porous ceramic disk member or other fluid permeable electrically resistive member is positioned above the membrane 108. Once the plating solution is introduced into the cathode chamber, the plating solution travels upward through the diffusion plate 110. The diffusion plate 110, which is generally a ceramic or other porous disk shaped member, generally operates as a fluid flow restrictor to even out the flow pattern across the surface of the substrate. Further, the diffusion plate 110 operates to resistively damp electrical variations in the electrochemically active area of the anode 105 or surface of the membrane 108, which is known to reduce plating uniformities.

Additional embodiments of the exemplary plating cell illustrated in FIG. 1 are illustrated in commonly assigned U.S. patent application Ser. No. 10/268,284 which was filed on Oct. 9, 2002 under the title "Electrochemical Processing Cell", claiming priority to U.S. Provisional Application Ser. No. 60/398,345 which was filed on Jul. 24, 2002, both of which are incorporated herein by reference in their entireties. Additional embodiments of the plating cell are also illustrated in commonly assigned U.S. patent application Ser. No. 10/627,336 filed on Jul. 24, 2003 entitled "Electrochemical Processing Cell", which is also incorporated by reference herein in its entirety.

Figure 2:
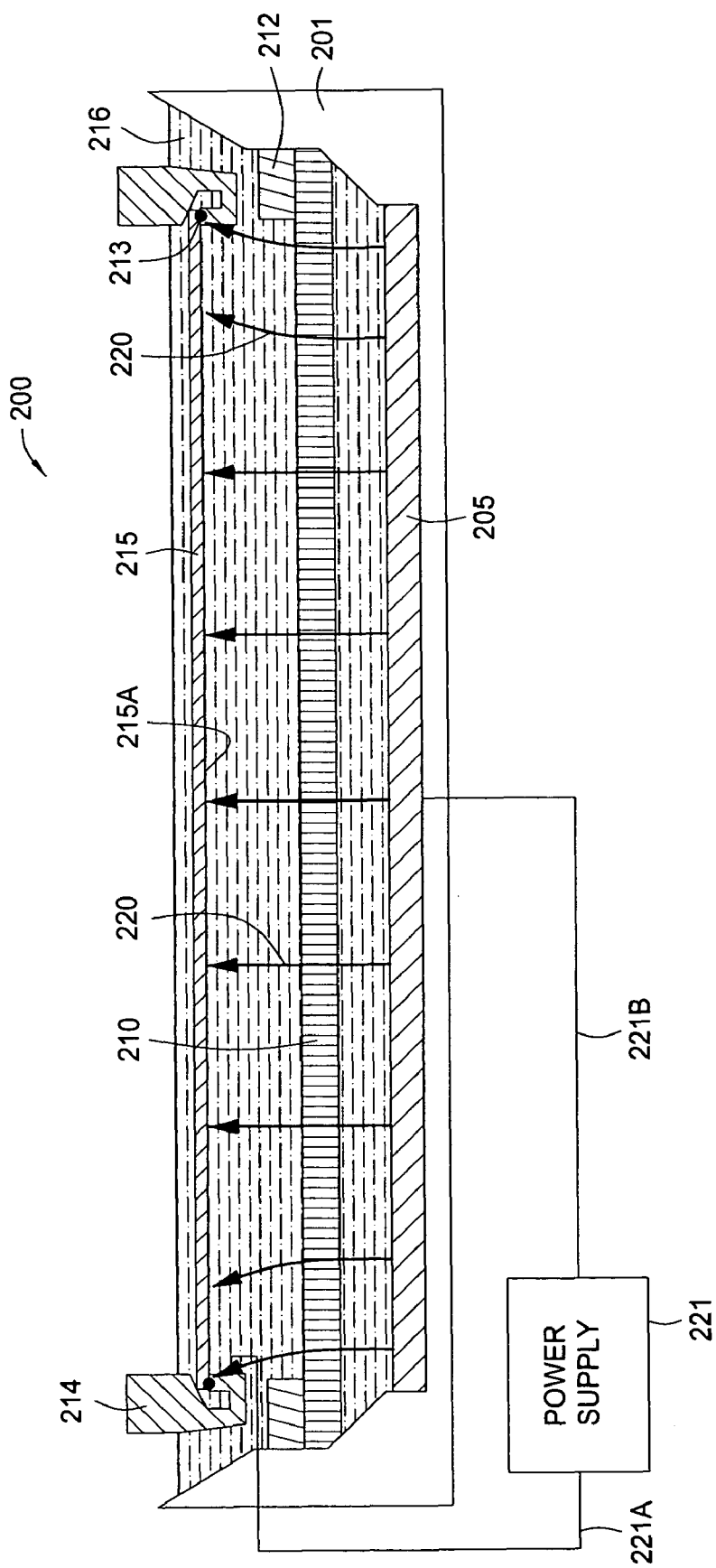
FIG. 2 illustrates a schematic sectional view of an exemplary plating cell and the electric field lines generated therein.

FIG. 2 illustrates a schematic view of an electrochemical plating cell 200, which is similar to the electrochemical plating cell 100 shown in FIG. 1, and the electric field lines generated therein when a plating process is being performed on the substrate 215. The plating cell 200 generally includes a fluid basin assembly 201 configured to contain a fluid volume 216, which is generally an electrolyte plating solution. An anode 205 is positioned in a lower portion of the fluid basin assembly 201 and a substrate 215 that is to be plated is generally positioned across an upper open portion of the cell 200. The substrate 215 is supported by a contact ring 214 that is configured to electrically contact a plating surface 215A of the substrate 215 near the perimeter of the substrate 215 via one or more electric contact elements 213. The substrate plating surface 215A has a conductive seed layer deposited thereon. The electric contact elements 213 are in electrical communication with a first terminal 221A of a power supply 221, while a second terminal 221B of the power supply 221 is in electrical communication with the anode 205. A collimator 212 having an annular shape is generally disposed above the diffusion plate 210 and below the contact ring 214. The collimator generally 212 has a diameter smaller than that of the substrate 215 and is configured to channel electric field in the fluid volume 216.

FIG. 2 also illustrates electric field lines 220 generated during a plating process in the plating cell 200. As noted above, the plating surface 215A has a conductive layer deposited thereon. The conductive layer formed on the plating surface 215A may in some cases be a conductive seed layer is generally very thin, and as such, is highly resistive. The resistive characteristics of the seed layer causes the electric field lines formed between the anode 205 and the plating surface 215A during a plating process to be much more dense near the perimeter of the plating surface 215A where electrical contact with the plating surface 215A is generally made. The electric field lines 220 inherently converge toward the electrical contact elements 213 as a result of the voltage drop formed in the conductive layer, where the higher voltage (cathodic bias) being proximate the contact elements 213. This higher voltage near the contact elements 213 then forms a path of least resistance. Several manufacturers of plating cells have attempted to solve the convergence problem by substantially increasing the resistivity of the electrolyte, however, it has been shown that this causes an unacceptable decrease in plating rates and does not sufficiently reduce the electric field convergence effect.

Figure 3:
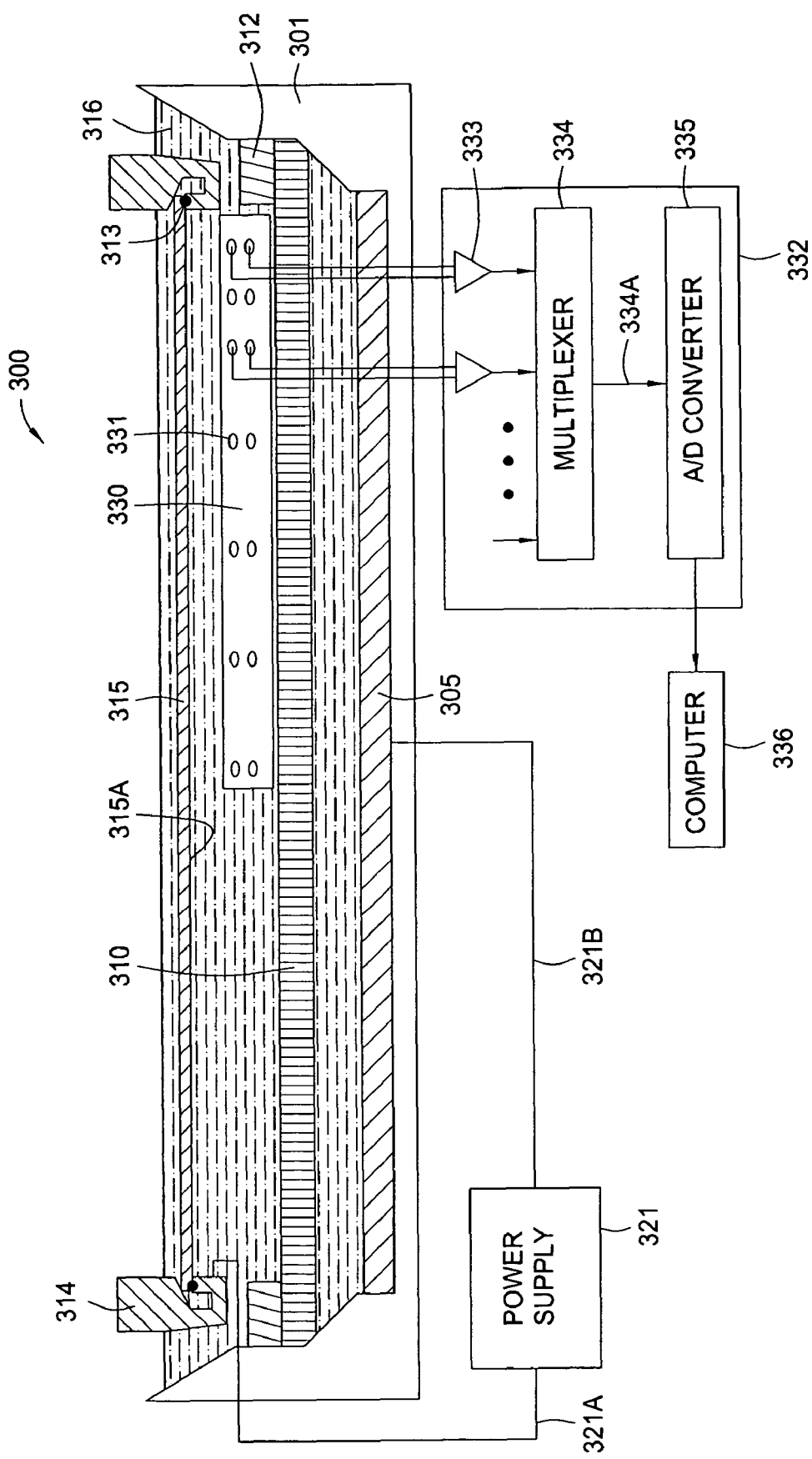
FIG. 3 illustrates a schematic sectional view of an exemplary plating cell of the present invention.

FIG. 3 illustrates a schematic sectional view of an exemplary plating cell 300 of the present invention. The plating cell 300 generally includes a fluid basin assembly 301 configured to contain a fluid volume 316, which is generally an electrolyte plating solution. An anode 305 is positioned in a lower portion of the fluid basin assembly 301 and a substrate 315 that is to be plated is generally positioned across an upper open portion of the cell 300. The substrate 315 is supported by a contact ring 314 that is configured to electrically contact a plating surface 315A of the substrate 315 near the perimeter of the substrate 315 via one or more electric contact elements 313. The electric contact elements 313 are in electrical communication with a first terminal 321A of a power supply 321, while a second terminal 321B of the power supply 321 is in electrical communication with the anode 305. A diffusion plate 310 is generally positioned between the substrate 315 and the anode 305. A collimator 312 having an annular shape is generally disposed above the diffusion plate 310 and below the contact ring 314. The collimator generally 312 has a diameter smaller than that of the substrate 315 and is configured to channel electric field in the fluid volume 316. In one aspect, the diffusion plate 310 may be placed close to the substrate 315, for example within 2-3 mm and a collimator may not be necessary.

Referring to FIG. 3, a sensor assembly 330 having an array of sensors 331 is generally disposed in the plating cell 300. The sensors 331 are floating in the plating cell 300 since they are not connected to a reference electrode. The sensors 331 may be wires made of copper, or a noble metal, for example, platinum, gold, palladium, Iridium, ruthenium, or copper plated over a noble metal. Two or more sensor 331 may be configured to sense the local voltage level between the sensors 331 positioned in the plating volume 316. The sensor assembly 330 is adapted to a signal sampling and processing circuit 332 configured to obtain local cell current distributions in the fluid volume 316 where the sensor assembly 330 is disposed. FIG. 3 illustrates a schematic configuration of one embodiment of a processing circuit 332 comprising a plurality of high input impedance differential amplifiers 333, one or more multiplexers 334, and an A/D converter 335. The plurality of high input impedance differential amplifiers are generally connected to the array of sensors 331 such that the two input pin of each high input impedance differential amplifier 333 are in electrical communication with two different sensors 331. Thus, each of the high input impedance differential amplifiers 333 outputs a differential voltage between two sensors 331. The high input impedance differential amplifiers 333 may be connected to the one or more multiplexers 334, which perform the function of selecting any one of multiple input lines and feeding the selected input to an output line 334A. The output line 334A of the multiplexer 334 may be connected to the A/D converter 335 which converts the analog signals into digital signals. The A/D converter 335 may be connected to a computer 336 having a program to process the differential voltage data and provide information of the electric field in the fluid volume 316. In one aspect, a real time thickness profile can be generated by integrating current values associated with the differential voltages. The computer 336 may be configured to calculate the current values from the measured differential voltage data and knowledge of properties of the plating solution, integrate the current values relative to plating time to get a thickness profile, then plot and/or display the thickness profile. Upon receiving and processing the differential voltages in the fluid volume 316, the computer 336 may further output a control signal to the power supply 321 and/or other controllable components in the plating cell 300 to adjust the localized intensity of the electric field, thus, performs a closed-loop control of plating processes.

Referring to FIG. 3, in one embodiment, the sensor assembly 330 is generally a rectangular printed circuit board with the array of sensors 331 distributed across length. The sensor assembly 330 may be positioned perpendicular to the plating surface 315A. One end of the sensor assembly 330 is positioned near the center of the plating surface 315A and the other end of the sensor assembly 330 is positioned near the perimeter of the plating surface 315A. In one aspect, the sensors 331 are distributed across the radius of the plating surface 315A such that the electric field corresponding to plating thickness across a radii of the substrate 315 can be monitored. In one embodiment, as shown in FIG. 3, the sensor assembly 330 may be positioned above the diffusion plate 310 and below the plating surface 315A. In one aspect, the sensor assembly 331 may be disposed in a position such that the sensors 331 are between about 1 mm to about 15 mm away from the plating surface 315A.

In one embodiment, not shown, the sensor assembly 330 may be integrated into the diffusion plate 310 rather than formed in a printed circuit board. In another embodiment, the sensors are positioned a known distance apart but not attached to a rigid element of the plating cell. In one embodiment, the sensors may be disposed anywhere in the entire plating cell including both catholyte chamber and anolyte chamber. In one aspect, the sensors may include an anode or a cathode (i.e. a contact pin) in a plating cell.

FIG. 3A illustrates a front view of an exemplary sensor assembly 330A of the plating cell 300 shown in FIG. 3. The sensor assembly 330A is generally a printed circuit board with an elongated portion of a different height. A taller portion of the sensor assembly 330A has two rows of sensors 331A. In one aspect, the sensors 331A in each row are distributed evenly along the length of the taller portion of the sensor assembly 330A and have a distance D1 from one another. In this configuration, the sensors 331A of a first row are positioned close to a top edge of the taller portion of the sensor assembly which enables the sensors 331A to measure the areas very close to the plating surface. Each sensor 331A of a second row is positioned directly underneath a respective sensor 331A of the first row and has a distance D2 from the respective sensor 331A of the first row. In one aspect, the distance D1 may be about 7.5 mm and the distance D2 may be about 7.5 mm. In another embodiment, not shown, the sensors 331A of each row may be unevenly distributed along the length of the sensor assembly 330A. In one aspect, a plurality of contacts 341A may be disposed in a shorter portion of the sensor assembly 330A. Each contact 341A is in electrical communication with one sensor 331A and is configured to connect the corresponding sensor with other circuits, such as the signal sampling and processing circuit 332 in FIG. 3.

In one aspect, the sensors 331A and 331B may be positioned in other arrangements such as at angels (not vertically or horizontally) relative to each other or any combination of vertical, horizontal and angular arrangements depending on their locations relative to the substrate or other elements of the plating cell. In one aspect, a sensor assembly may be formed in a coordinate system, such as a 3D coordinate system, a polar coordinate system, and an elliptical coordinate system, that can describe an electric field in a plating cell.

FIG. 3B illustrates a front view of an exemplary sensor assembly 330B of the plating cell 300 shown in FIG. 3. The sensor assembly 330B is generally a printed circuit board with an elongated portion of a different height. A taller portion of the sensor assembly 330B has three rows of sensors 331B. In one aspect, the sensors 331B in each row are distributed evenly along the length of the taller portion of the sensor assembly 330B and are spaced a distance D3 from one another. In one aspect, the sensors 331B of a first row are positioned close to a top edge of the taller portion of the sensor assembly which enables the sensors 331A to measure the areas very close to the plating surface. Each sensor 331B of a second row and of a third row is positioned directly underneath a respective sensor 331B of the first row and are spaced a distance D4 from the respective sensor 331B in the row above. In one aspect, the distance D3 may be about 3.75 mm and the distance D4 may be about 3.75 mm. In another embodiment, not shown, the sensors 331B of each row may be unevenly distributed along the length of the sensor assembly 330B. In one aspect, a plurality of contacts 341B are generally disposed in a shorter portion of the sensor assembly 330A. Each contact 341B is in electrical communication with one sensor 331B and is configured to connect the corresponding sensor with other circuits, such as the signal sampling and processing circuit 332 in FIG. 3.

Other arrangements for the locations of individual sensors and/or groups of sensors can also be used.

Figure 3E:
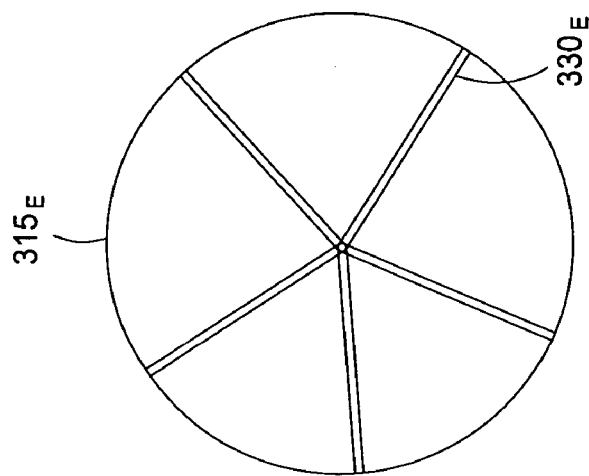
FIG. 3E illustrates a top view of an exemplary arrangement of a sensor assembly of the present invention.
Figure 3D:
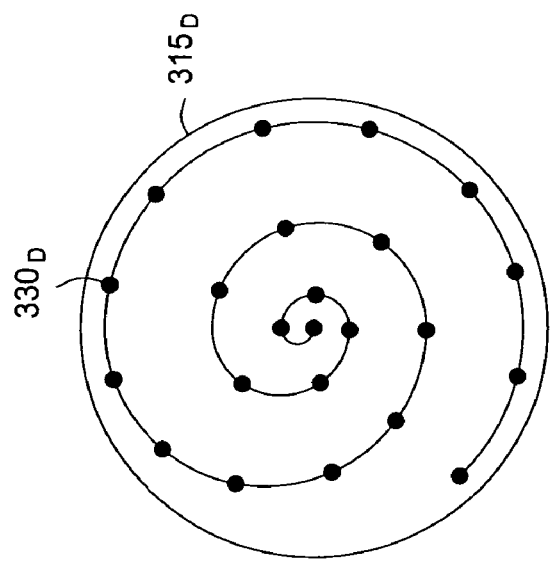
FIG. 3D illustrates a top view of an exemplary arrangement of a sensor assembly of the present invention.
Figure 3C:
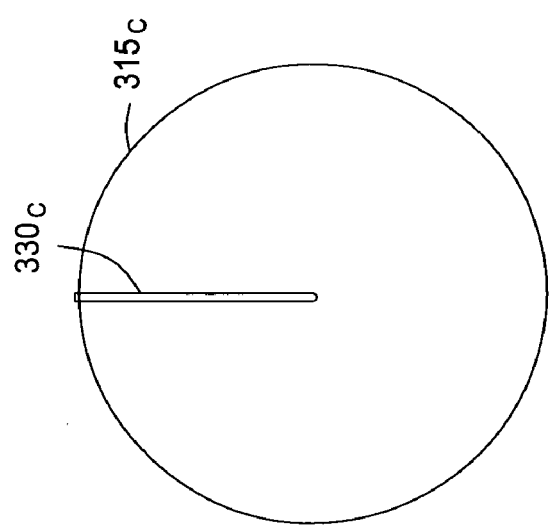
FIG. 3C illustrates a top view of an exemplary arrangement of a sensor assembly of the present invention.

FIG. 3C illustrates a top view of an exemplary arrangement of a sensor assembly 330C relative to a substrate 315C being plated. In one embodiment, one end of the sensor assembly 330C is positioned near the center of the substrate 315C and the other end of the sensor assembly 330C is positioned near the perimeter of the substrate 315C. Sensors in the sensor assembly 331C are distributed in a straight line across the radius of the substrate 315C such that the electric field corresponding to a plating thickness across the substrate 315C can be monitored. In another embodiment, as shown in FIG. 3D, a plurality of sensor assemblies 330D are distributed in a spiral pattern across a substrate 315D. This arrangement enables monitoring both an electric field across the radius of the substrate 315D and an electric field in different segments of the plating fluid. Comparing to the arrangement shown in FIG. 3C, this arrangement also enables a higher sensor density, especially near the perimeter of the substrate 315D. FIG. 3E illustrates a top view of another exemplary arrangement of sensor assemblies 330E of the present invention. A plurality of sensor assemblies 330E, five as shown in FIG. 3E, are distributed radially from the center of a substrate 315E. This arrangement enables monitoring both an electric field across the radius of the substrate 315E and an electric field in different segments of the plating solution.

Figure 4A:
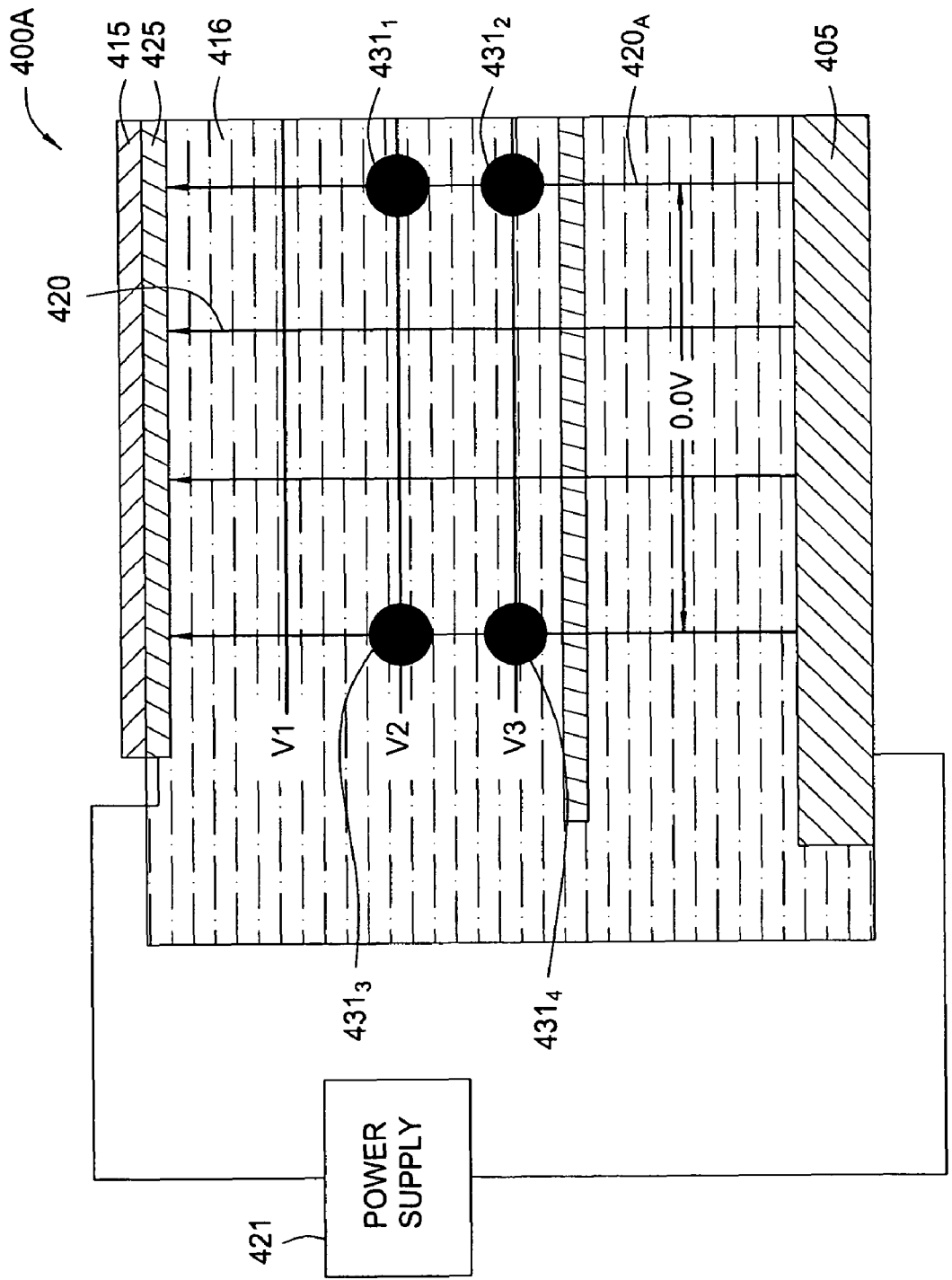
FIG. 4A illustrates a sectional view of an exemplary plating cell with uniform electric field.

FIG. 4A illustrates a schematic view of a plating cell 400A with a uniform electric field. The plating cell 400A generally comprises an anode 405, a substrate 415 having a conductive seed layer 425, an electrolyte volume 416, a power supply 421, and an array of sensors $431_{1-4}$ configured to measure local voltage levels in the electrolyte volume 416. The power supply 421 is coupled to the conductive seed layer 425 and the anode 405. Both the anode 405 and the conductive layer 425 are in contact with a plating solution retained in the electrolyte volume 416. A uniform electric field is generated in the electrolyte volume 416 when the power supply 421 provides a voltage between the conductive layer 425 and the anode 405. The electric field strength is represented by iso-voltage lines V1, V2, V3 and electric field lines 420. The iso-voltage lines V1, V2 and V3 are indicative of voltage levels in the electrolyte volume 416 and are parallel to the seed layer 425. The electric field lines travel perpendicularly to the voltages lines indicating an ion flux or currents in the electrolyte volume 416. As shown in FIG. 4A, the sensors $431_1$ and $431_3$ are positioned in the same voltage line V2, thus, generally the voltage measured between $431_1$ and $431_3$ will equal zero since the difference voltage values ΔV will be V2-V2. Sensors $431_1$ and $431_2$, on the other hand, are positioned in the iso-voltage lines V2 and V3 respectively, thus, will generally output voltage values reflecting V2 minus V3 respectively. Since sensors $431_1$ and $431_2$ are positioned in the same electric field line $420_1$, the differential voltage between voltage values at $431_1$ and at $431_2$ is associated with the current value of the electric field line 420A in the form of, $$\text{local current density} = \frac{\text{differential voltage between sensors}}{(\text{geometry constant}) \times (\text{electrolyte resistance}) \times (\text{distance between sensors})} \quad \text{(equation 1)}$$

In this case, when the plating cell 400A has a uniform electric field, measuring voltage drop between sensors by positioning two sensors in the electrolyte volume 416 allows estimating the local current density. The local current density can then be correlated to a total charge and a local plating thickness.

Figure 4B:
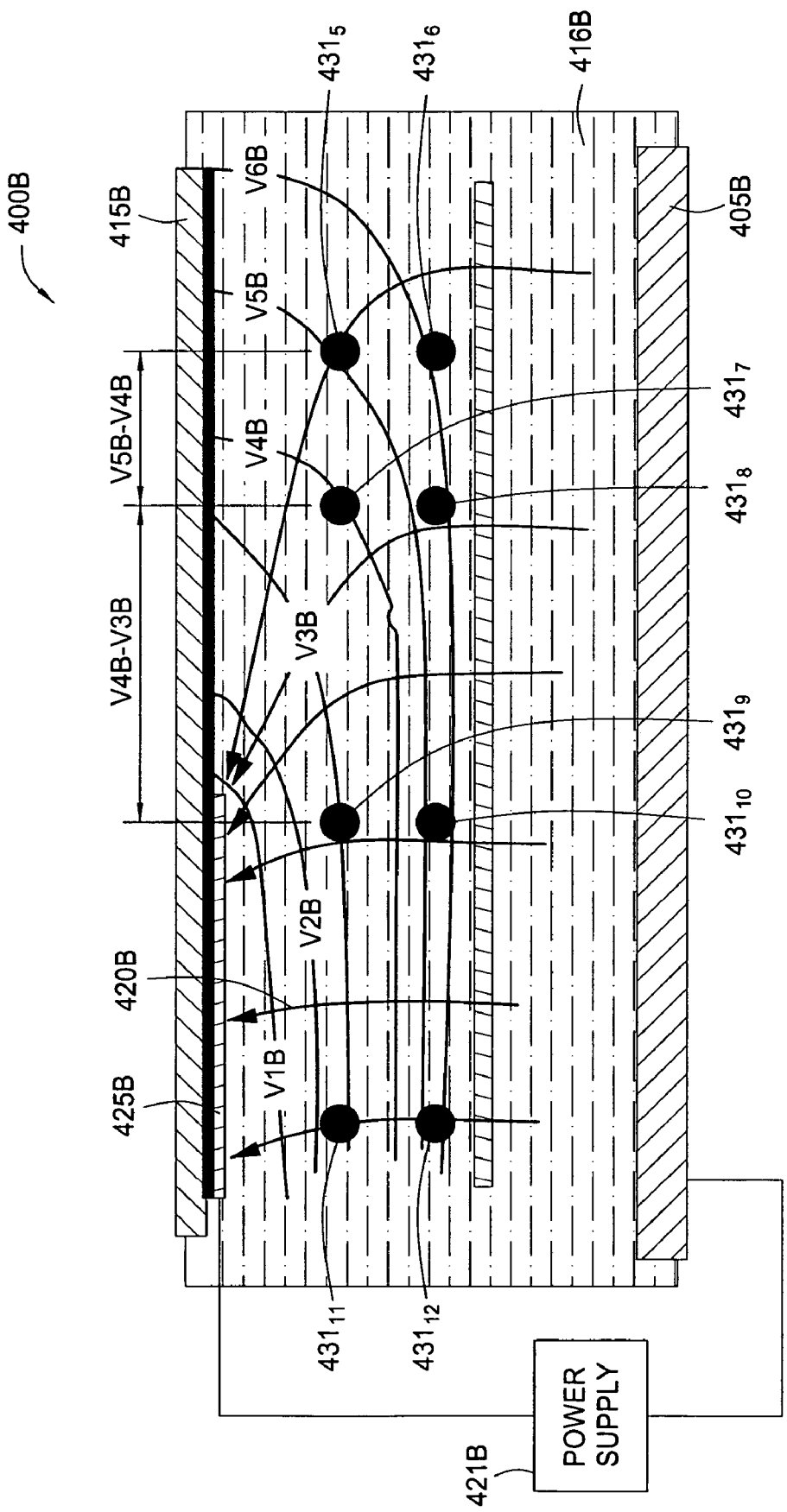
FIG. 4B illustrates a sectional view of an exemplary plating cell with non-uniform electric field.

As described in relation to FIG. 2, the electric field in the plating cell may be a non-uniform field, especially near the perimeter of a plating surface. FIG. 4B illustrates a schematic view of a plating cell 400B with a non-uniform electric field. The plating cell 400B generally comprises an anode 405B, a substrate 415B having a conductive seed layer 425B, an electrolyte volume 416B, a power supply 421B, and an array of sensors $431_{5-12}$ configured to measure local voltage levels in the electrolyte volume 416B. The power supply 421B is coupled to the conductive seed layer 425B and the anode 405B. Both the anode 405B and the conductive layer 425B are in contact with a plating solution retained in the electrolyte volume 416B. A electric field which in some cases may be non-uniform is generated in the electrolyte volume 416B when the power supply 421 provides a voltage between the conductive layer 425B and the anode 405B. The electric field is represented by iso-voltage lines V1B-V6B and electric field lines 420B. In this example, the electric field lines 420B a distance away from the surface of the substrate are not perpendicular to the conductive layer 425B. Thus, local current densities may not be easily predicted from voltage measurements of sensors perpendicular to the conductive layer 425B. An additional horizontal component of a differential voltage may be measured to calculate the current density. As shown in FIG. 4B, the sensors $431_5$, $431_7$, $431_9$ and $431_{11}$ are positioned in one horizontal line parallel to the plating surface 425B, the voltage levels measured between these positions are different due to the non-uniformity of the electric field. Thus, the horizontal component of a differential voltage can be obtained by measuring the voltage difference between two sensors. For example, the voltage levels measured between sensors $431_5$ and $431_7$, and between $431_8$ and $431_7$ can be used to calculate the magnitude and direction of current density in this region. The horizontal component dVh can be calculated from dVh=voltage level at $431_5$—voltage level at $431_7$. The vertical component dVn can be calculated from dVn=voltage level at $431_8$—voltage level at $431_7$. Then the differential voltage dV at $431_7$ can be calculated by a vector summation of dVn and dVh, as shown in FIG. 3C. Then the local current density can be calculated using equation 1.

Figure 4C:
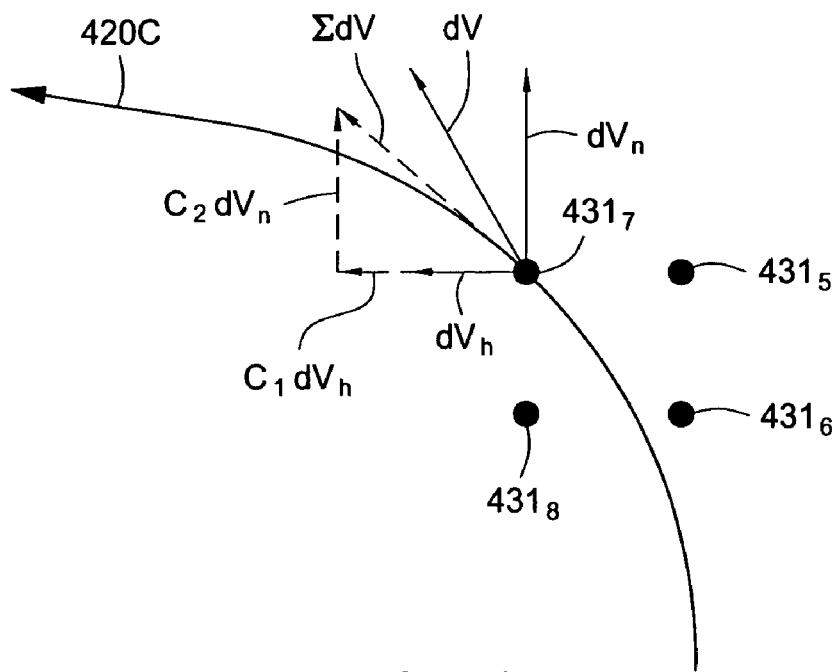
FIG. 4C illustrates a set of exemplary geometry factors.

However, as shown in FIG. 4C, the differential voltage dV calculated from dVn and dVh may vary compared to the actual differential voltage ΣdV in a non-uniform electric field partially because the finite distances between the sensors. In one aspect, this deviation can be compensated by introducing a set of geometry coefficients, for example, a horizontal geometry coefficient C1 and a vertical geometry coefficient C2. The horizontal component dVh and the vertical component dVn are first multiplied by C1 and C2 respectively, then summed together to obtain the actual differential voltage ΣdV. Equation 2 provides a scalar form of this calculation:

$$\Sigma dV = \sqrt{(C_1 dVh)^2 + (C_2 dVn)^{26}} \quad \text{(equation 2)}.$$

Applying geometry coefficients in obtaining differential voltage of a non-uniform electric field has been proven to be effective and methods of identifying geometry coefficients will be described below.

Referring to FIG. 4B, local current density in the middle of the electrolyte volume 416B may be significantly different from the local current density near the conductive layer 425B. Thus, it is desirable to position the sensors 431 close to the conductive layer 425B to calculate plating thickness from differential voltages measured by the sensors 431.

Figure 4D:
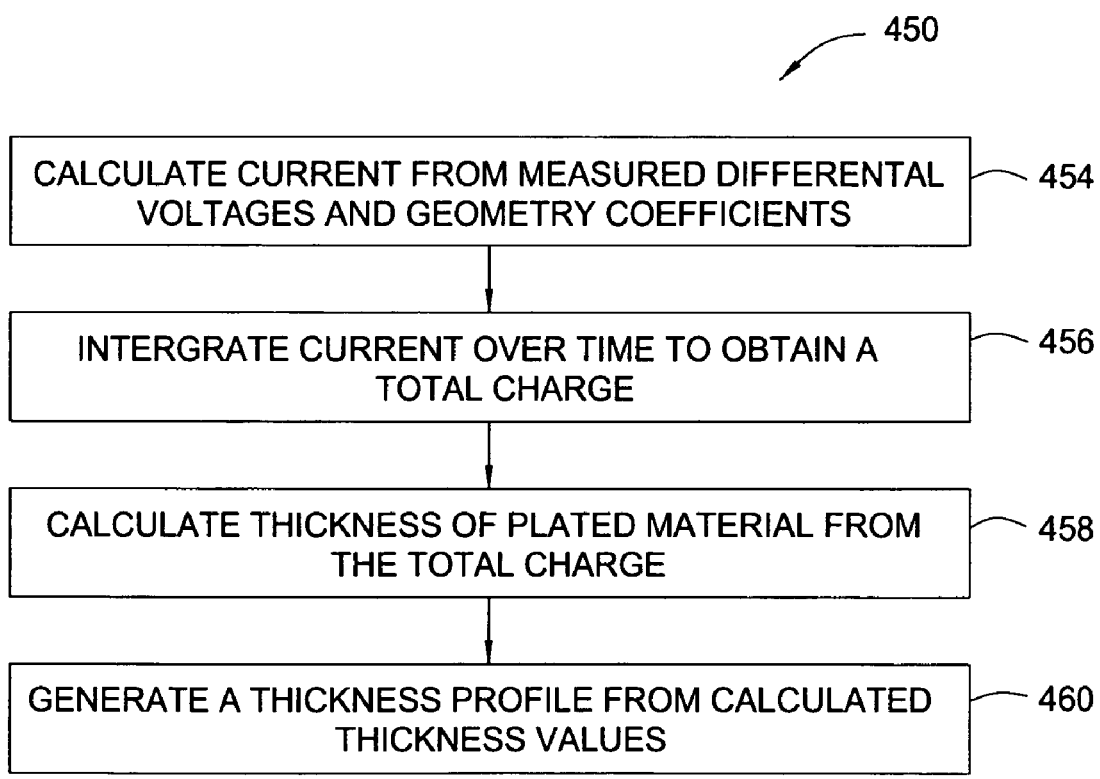
FIG. 4D illustrates an exemplary embodiment of generating a thickness profile from cell current distributions.

FIG. 4D illustrates an exemplary embodiment of method of generating a thickness profile measurement from measured differential voltages. A thickness profile measurement can be depicted by use of a 2D curve with an x-axis indicates the distance to the center or edge of a substrate and a y-axis indicates a thickness of plated material. In step 454, current across the x-axis is calculated from measured differential voltages. This step may be contacted in two parts. First, for each sample point, an actual differential voltage is calculated from measured horizontal and vertical voltages between two or more sensors and a set of geometry coefficients is calculated by using an mathematical model, such as, for example, equation 2. Then a local current density is calculated using equation 1. The voltage levels at each sample point may be periodically sampled during the course of a plating process. Thus, a set of local current density values may be obtained for each sample point.

In step 456 of FIG. 4D, for each sample point, a total charge is obtained by integrating the local current over plating time. The integral may be approximated by a summation, $$\text{Total charge }(t) = \Sigma(i(t) \cdot \Delta t) \Delta A \quad \text{(equation 3)}$$

where ΔA indicates a corresponding area on the substrate or a distance along the radius for each sample point and i is local current density at each sample point.

In step 458, the total charge at each sample point is correlated to a thickness of plated material by calculation or through an empirical look up table. For example, in a process that $Cu^{2+}$ ions are being plated on the substrate. It is known that for a copper crystal: a=b=c=361.49 pm=3.6149 Å. Thus, the volume of a unit cell is 47.23 $Å^3$. Since there are four (4) atoms in a unit cell and two (2) charges per atom, the total charge required to deposit a unit cell is: 4 atoms*2 charges*$1.6e^{-19}$ Coulombs. The total charge required to deposit a thickness of 3.6149 Å (i.e. a layer of unit cells) on a sample area is 4 atoms*2 charges*$1.6e^{-19}$*sample area/ 3.6149 Å/3.6149 Å Coulombs.

In step 460, a thickness profile is generated from calculated thickness of plated material from step 458. In one aspect, the thickness profile may be calculated by adding the plated thickness to an initial thickness, as shown in equation 4.

Thickness=Initial Thickness+Thickness of plated Material (Equation 4)

Figure 5:
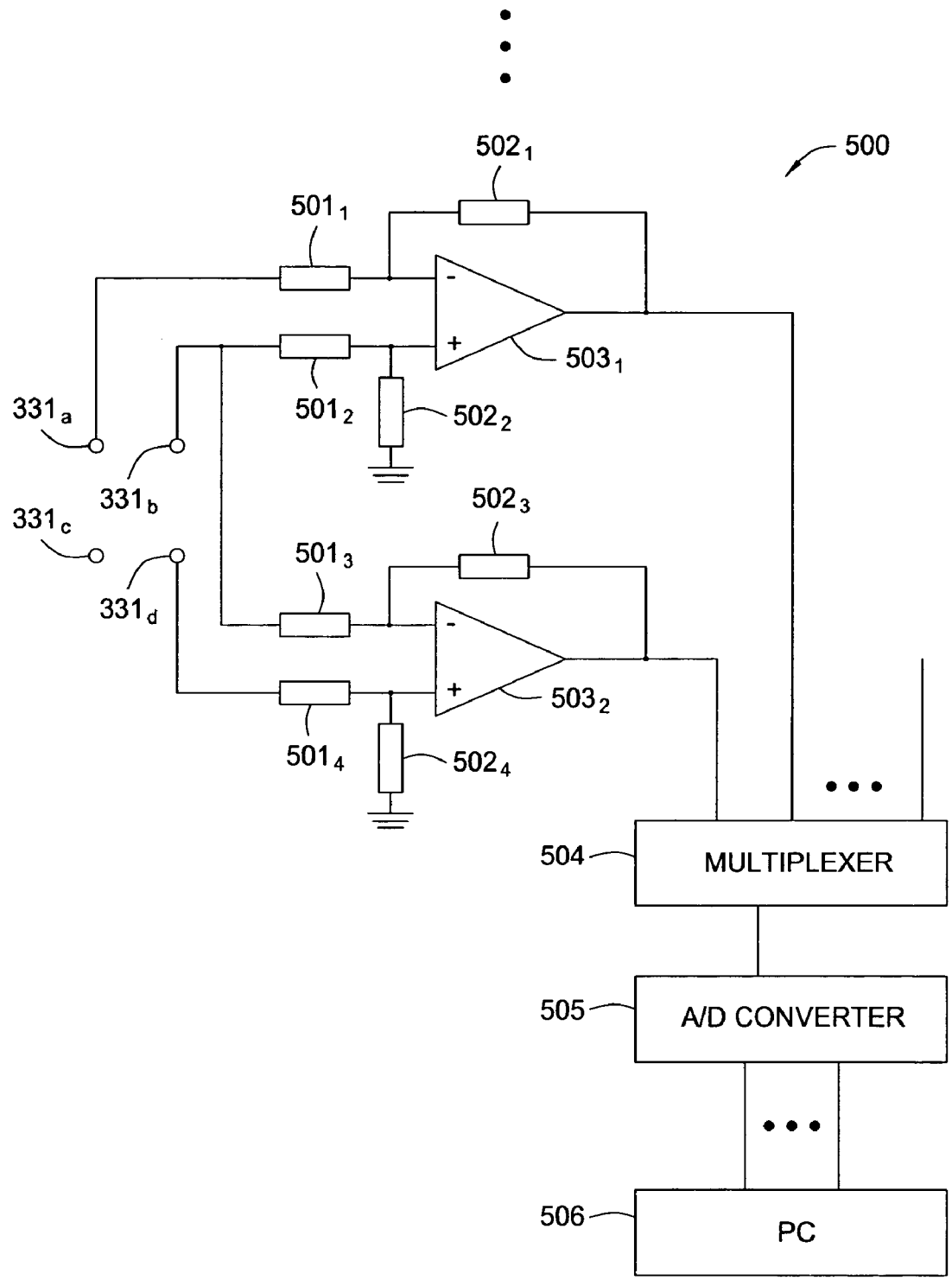
FIG. 5 illustrates an exemplary embodiment of data sampling and processing circuit for the array of sensors in the present invention.

A thickness profile may be generated by integrating current in the electrolyte over plating time. Current values may be calculated from differential voltages in the electrolyte. Differential voltages can be obtained by measuring voltage differences between sensors using a differential voltage device. One implementation of a differential voltage measuring device, shown in FIG. 5, senses and amplifies voltage differences between sensors, then converts amplified differential voltages to a digital signal. In this implementation, a plurality of high input impedance differential amplifiers 503 are used to measure and amplify voltage differences between sensors. For each high input impedance differential amplifier 503, each of the two input pins is connected to a resistor 501 which connects to a sensor 331; a resistor 502, connects the negative input pin of 503 to the output pin of 503; the positive input pin of 503 connects to the ground through a resistor 502$_2$. The voltage differences between the sensors 331 corresponding to the input pins is amplified by $R_{502}/R_{501}$ times. For example, the resistors 502 may have a resistance of 100 k ohms and the resistors 501 may have a resistance of 1 k ohms. The voltage difference between the input pins may be amplified by 100 times. As shown in FIG. 5, the high input impedance differential amplifiers 503 may be used to sense and amplify horizontal and vertical components of differential voltages. The outputs of the high input impedance differential amplifiers 503 are then connected to input pins of one or more multiplexers 504 and be sequenced and input to an A/D converter 505. In one aspect, the A/D converter 505 may be a 12-bit A/D converter. The output of the A/D converter 506 is then connected to a computer 506 through a data bus. The computer 506 may have a program that can use the measured differential voltages to generate a real time thickness profile, identify a set of geometry coefficients, control a plating process, optimize a plating process, and more. Embodiments of methods and apparatus of utilizing the differential voltages in an electrochemical process are given in FIGS. 6-11.

Figure 6:
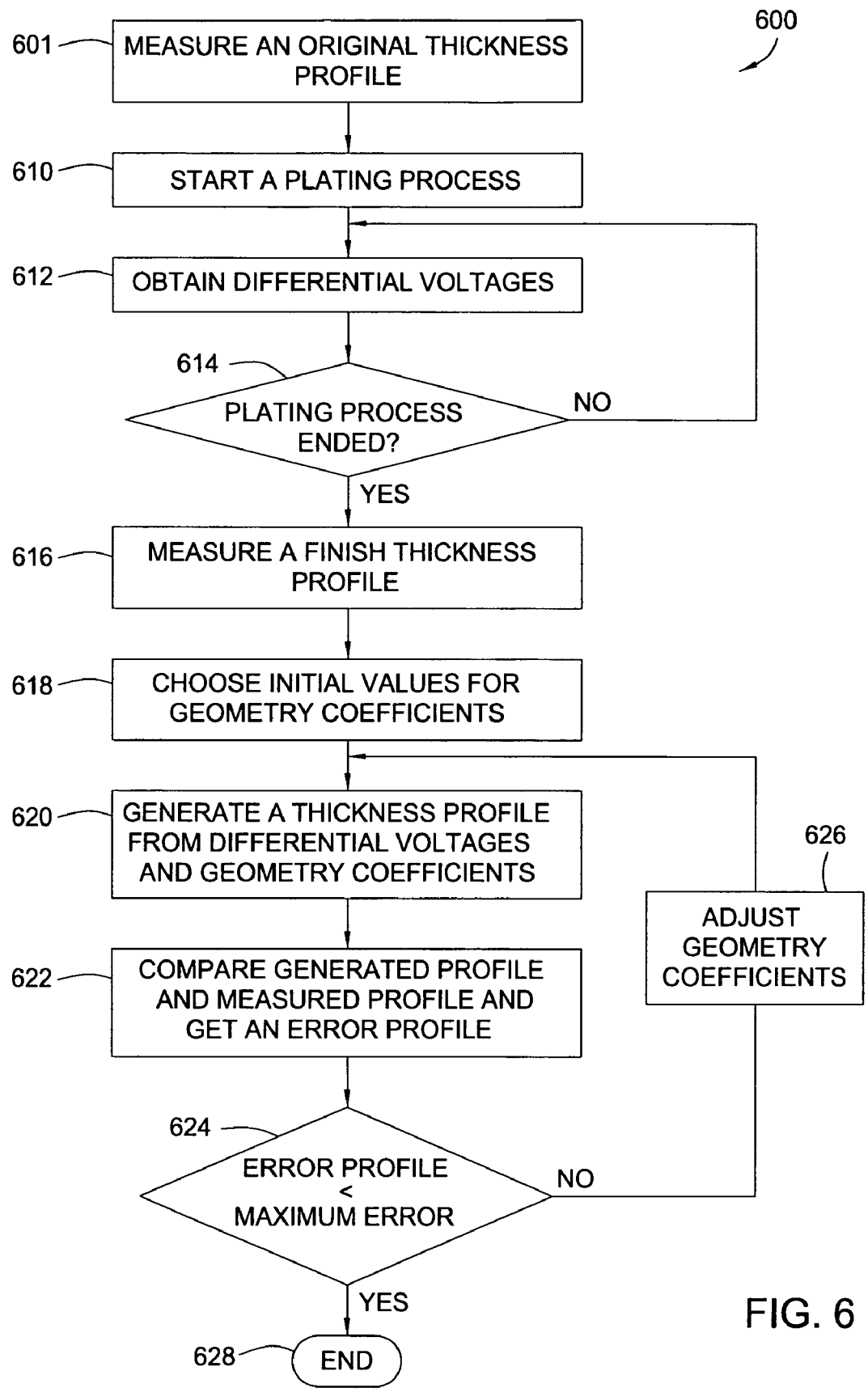
FIG. 6 illustrates an exemplary embodiment of identifying geometry factors.

FIG. 6 illustrates an exemplary embodiment of identifying a set of geometry coefficient. In this embodiment, an original thickness (of a seed layer) may be measured using a thickness measuring device, for example, through surface resistivity or x-ray reflectivity measurements. Then start a plating process in a plating cell with an array of sensors disposed in the electrolyte. Differential voltages are measured periodically using the sensors and data collecting devices discussed above in conjunction with FIGS. 3-5 till the end of the plating process. A final thickness profile can then be measured using the thickness measuring device. Initial values can then be chosen for a set of geometry coefficients. Next, in step 620, a generated thickness profile can be obtained from the measured differential voltages, the geometry coefficients and the original thickness profile, as described in FIG. 4D. In step 622, the generated thickness profile is compared to the measured thickness profile obtained in step 616. An error profile or a parameter indicating the difference between the generated and measured thickness profiles is evaluated in step 624. If the error or the difference exceeds a limit of a predetermined tolerance, for example, a maximum error, step 626 is executed and new values geometry coefficients are given. Steps 620, 622, 624, and 626 will be run iteratively until the error or the difference is within a limit of a predetermined tolerance. Then the process will stop and the geometry coefficients are identified. Empirical results have shown that geometry coefficients mainly depend on electrolyte conductivity. Initial resistivity of a substrate may have a small influence on the geometry coefficients too. Thus, once identified, a set of geometry coefficient can be applied to generate thickness profile for plating processes having the same electrolyte conductivity and similar substrate initial resistivity.

Figure 7:
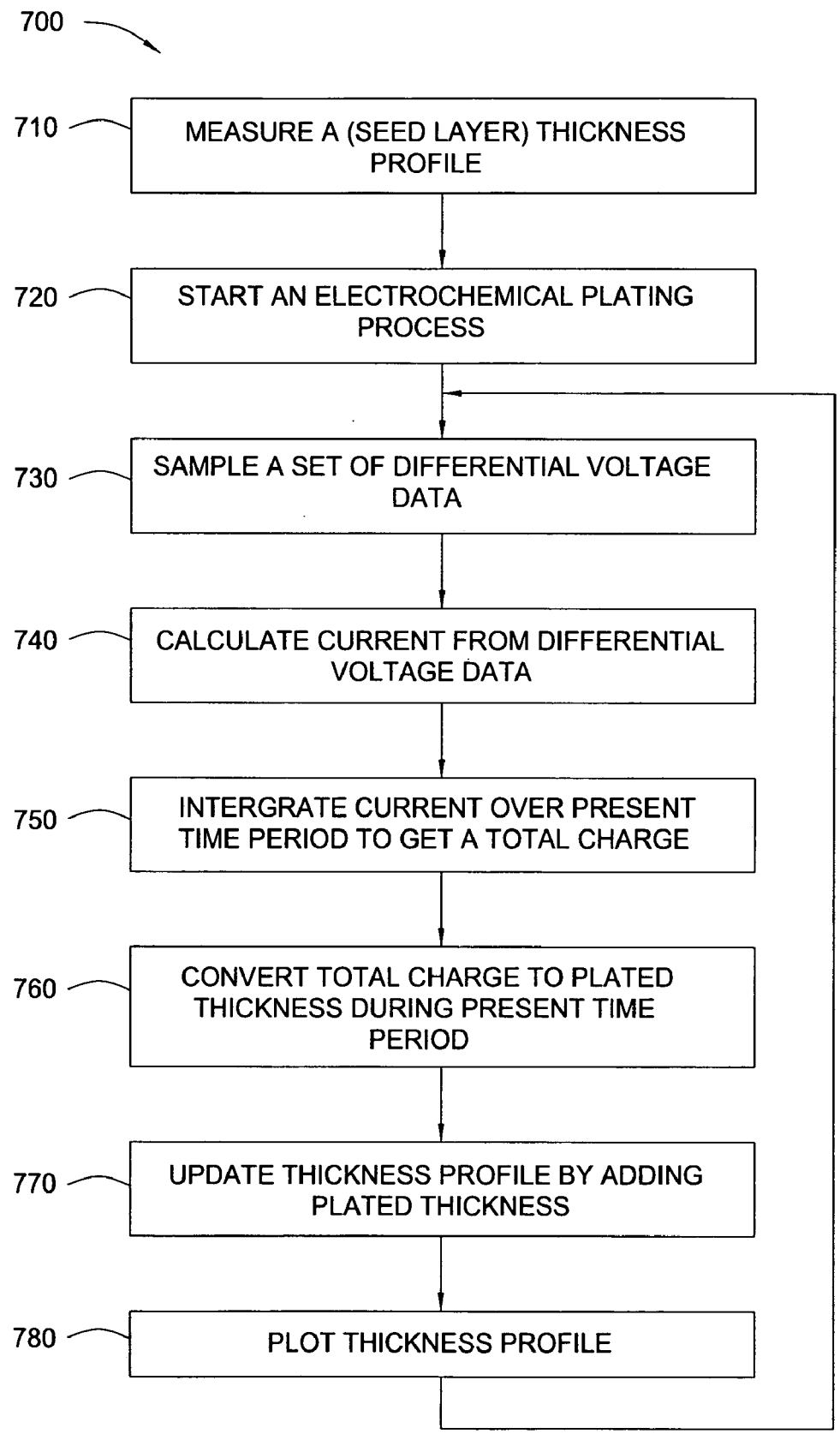
FIG. 7 illustrates an exemplary embodiment of generating real time thickness profiles.

FIG. 7 illustrates an embodiment of the present invention for generating real time thickness profiles during a plating process. An original thickness profile may be measured by a probe before the plating process, as described in step 710. In one aspect, step 710 may be done only once for a batch of substrates where incoming layer thickness may not vary that much. In step 720, an electrochemical plating process is stated in a plating cell having an array of sensors disposed in the electrolyte. After the plating process has started, steps 730-780 may be performed periodically or in variable frequencies depending on process parameters. Step 730 involves sampling differential voltage data, for example, horizontal differential voltages (dVh) and vertical differential voltages (dVn). Step 740 may comprise calculating actual differential voltages from the differential voltage data using a set of geometry coefficients, and calculating current densities form the actual differential voltages. Step 750 generally includes integrating the current densities over the sample time to obtain total charge values. Step 760 generally includes correlating the total charge values to plated thickness values. Step 770 generally includes updating the thickness profile by adding the plated thickness values. In step 780, the updated thickness profile may be plotted or presented in other manners, thus enables automatic or interactive adjust the plating process.

Figure 8:
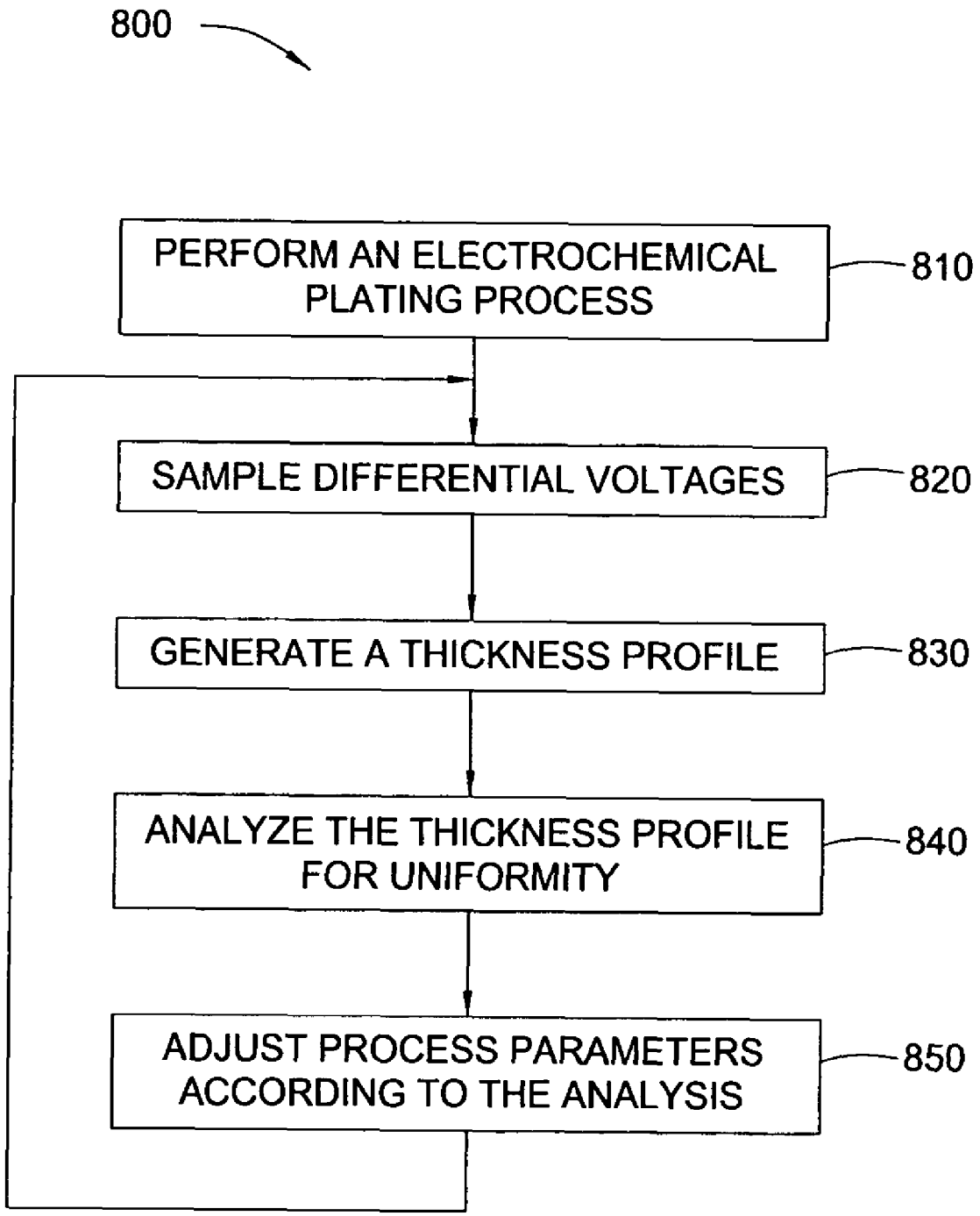
FIG. 8 illustrates an exemplary embodiment of achieving uniform thickness during an electrochemical plating process.

FIG. 8 illustrates an embodiment of the present invention for achieving uniform thickness during an electrochemical plating process. In step 810, an electrochemical plating process is performed in a plating cell having an array of sensors disposed therein. After the plating process has started, steps 820-850 may be performed periodically or in variable frequencies depending on process parameters. Step 820 involves sampling differential voltage data, for example, horizontal differential voltages and vertical differential voltages. In step 830, a real time thickness profile is generated. In one aspect, this step can be implemented as described in steps 740 to 770 in FIG. 7. Step 840 generally includes analyzing the real-time thickness profile and determining uniformity of the plated surface. In determining uniformity, geometry features of the thickness profile, such as flatness, may be calculated, and high and low points in profile may be marked. In step 850, one or more process parameters may be adjusted according to the surface uniformity. It is to be noted, if uniformity is satisfactory, process parameters not need to be adjusted. Process parameters that may be adjusted include, but are not limited to one or more of current set point, anode timing, thief current, head spacing, current and timing of anode elements. Detailed information of anode elements are described in the U.S. Provisional Patent Application Ser. No. 60/684,444, filed on May 25, 2005 under the title "Electroplating apparatus based on an array of anodes" which is incorporated herein by reference of its entirety.

Figure 9:
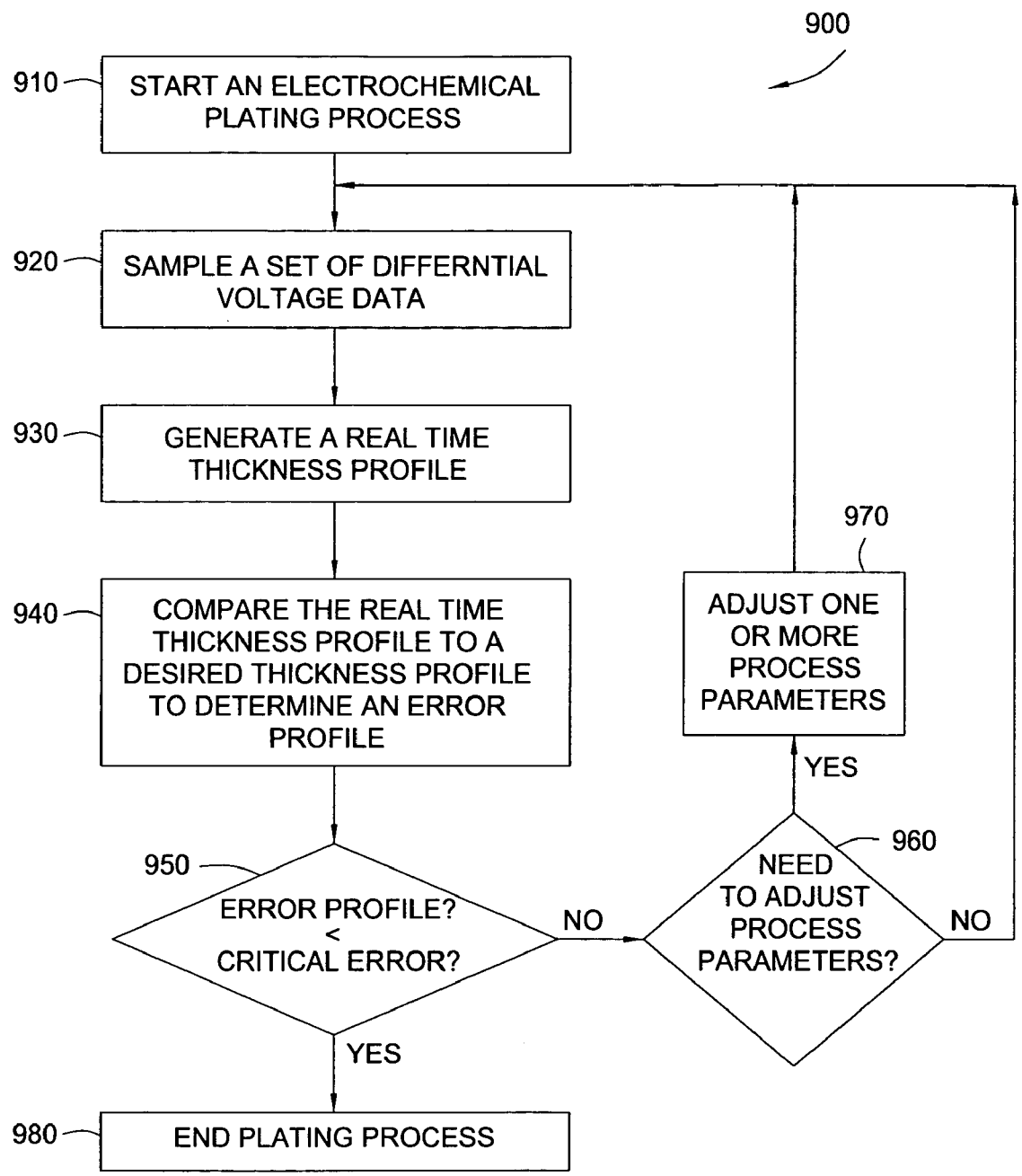
FIG. 9 illustrates an exemplary embodiment of achieving a desired thickness profile during an electrochemical plating process.

FIG. 9 illustrates an embodiment of the present invention for achieving a desired thickness profile during an electrochemical plating process. In step 910, an electrochemical plating process is performed in a plating cell having an array of sensors disposed therein. After the plating process has started, steps 920-960 may be performed periodically or in variable frequencies depending on process parameters. Step 920 involves sampling differential voltage data, for example, horizontal differential voltages and vertical differential voltages. In step 930, a real time thickness profile is generated. In one aspect, this step can be implemented as described in steps 740 to 770 in FIG. 7. In step 940, the real time thickness profile is compared to a desired thickness profile obtained and an error profile or a parameter indicating the difference between the real time thickness profile and the desired thickness profiles is obtained. If the error or the difference exceeds a limit of a predetermined tolerance, for example, a critical error, step 960 is performed. When the error or the difference is within a limit of a predetermined tolerance, the plating process will stop. Step 960 determines if the process parameters that need to adjusted. In one aspect, determining process may include analyzing the error profile. In step 970, one or more process parameters may be adjusted according to the error profile. Adjusting process parameters may be one or more of current set point, anode timing, thief current, head spacing, current and timing of anode elements.

Figure 10:
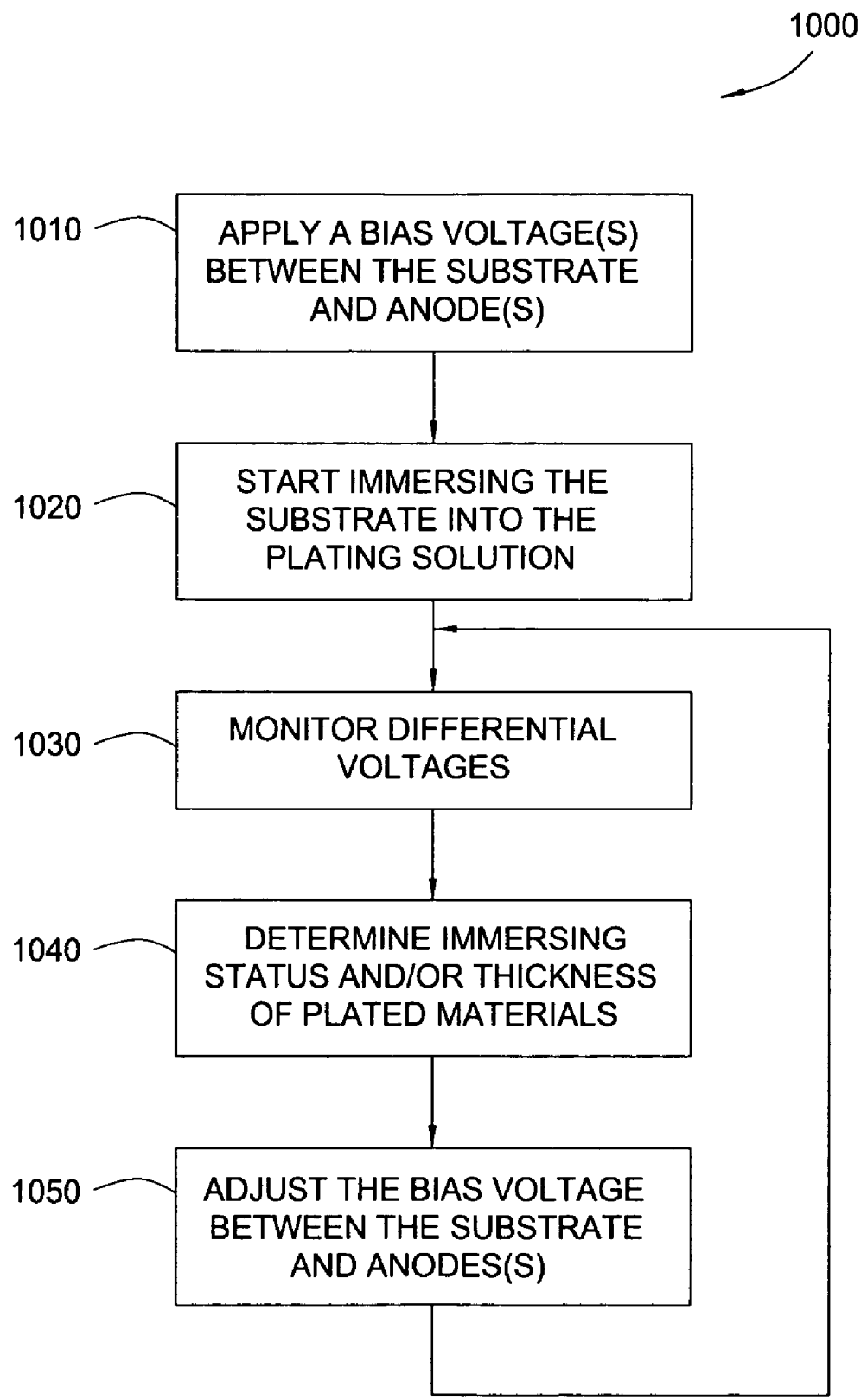
FIG. 10 illustrates an exemplary embodiment of monitoring immersing a substrate into a plating solution.

FIG. 10 illustrates an embodiment of the present invention for monitoring the process of immersing a substrate into a plating solution of a plating cell. During step 1010, a cathodic voltage bias is generally applied between the substrate and an anodically biased electrode (anode). During step 1020, the substrate is being immersed into the plating cell having an array of sensors disposed therein. In step 1030, differential voltages of the plating solution is monitored by sampling and processing signals from the sensors. Step 1040 generally includes determining the immersing status of the substrate and/or generating a thickness profile. As a substrate is immersed in the plating solution, thus electrical communication is established, the one or more sensors in the array of sensors is noted so that difference between various regions of the substrate can be compensated for during the process. A real time thickness profile can also be generated, for example, by a process described in steps 740-770. In step 1050, the bias may be adjusted according to the immersing status. When the anode is segmented, bias of each segment of anode may be adjusted independently. The process described in FIG. 10 may be added to the processes described in FIGS. 7-9.

Figure 11:
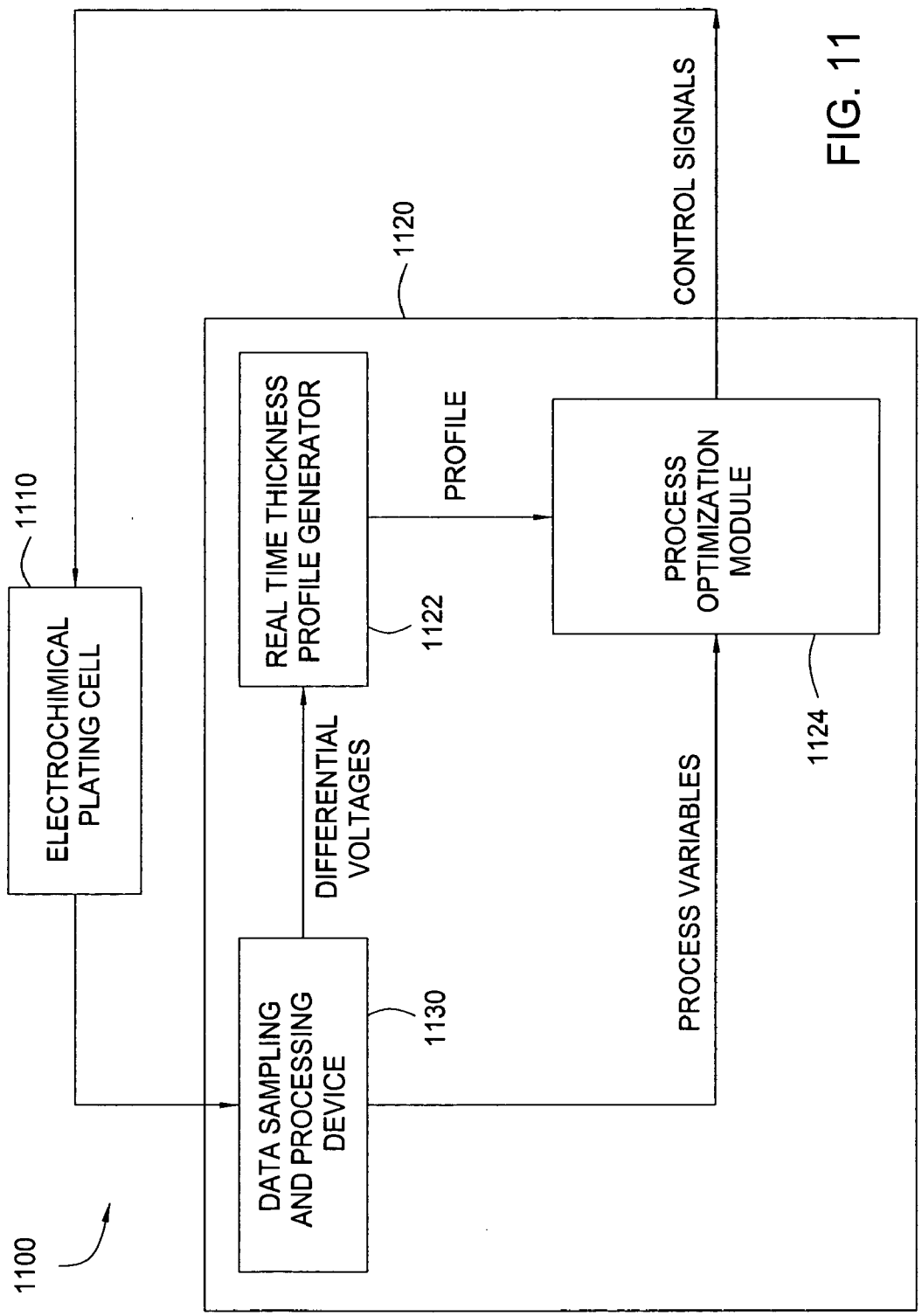
FIG. 11 illustrates an exemplary embodiment of an electrochemical plating system of the present invention.
Figure 11A:
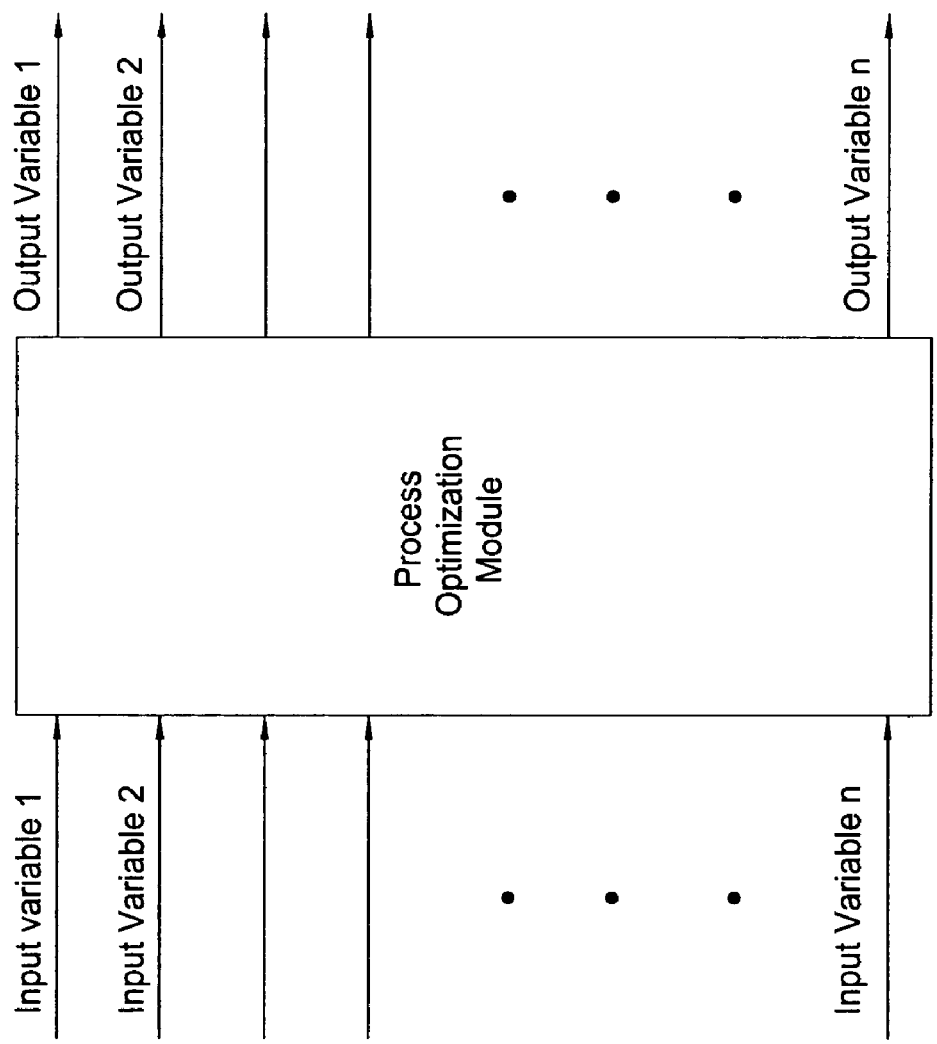
FIG. 11A illustrates an exemplary embodiment of the process optimization software of the electrochemical plating system shown in FIG. 11.

FIG. 11 illustrates an exemplary embodiment of an electrochemical plating system 1100 of the present invention. The system 1100 generally comprises an electrochemical plating cell 1110 and a control unit 1120 coupled to the plating cell 1110 such that various process variables can be monitored by the control unit 1120 and the control unit 1120 can send control signals to the plating cell 1110 to adjust process variables to control the plating results. The control unit 1120 generally comprises a data sampling and processing device 1130, a real time thickness profile generator 1122, and a process optimization module 1124. The plating cell 1110 may have a plurality of sensors the data sampling and processing device 1130 of the control unit 1120. The plurality of sensors may include an array of sensors disposed in an electrolyte of the plating cell 1110 and configured to measure differential voltages in the electrolyte. The data sampling and processing device 1130 is configured to sample and process the signals from the plurality of sensors and output processed process variables to the process optimization module 1124. The processing variables may comprise, for example, but are not limited to differential voltages, bath temperature, wafer height, acidity, head rotation, tilt angle, and anode condition. In one aspect, the data sampling and processing device 1130 may output differential voltage measurements to the real time thickness profile generator 1122 which is configured to generate real time thickness profiles and output to the process optimization module 1124. The real time thickness profile generator 1122 may comprise software and/or hardware to implement processes described in FIGS. 7 to 10. The process optimization module 1124 may include software and/or hardware to optimize the plating process conducted in the plating cell 1110 by sending a plurality of control signals which may include, for example, current set point, anode timing, anode segment control signal, thief current, head spacing. FIG. 11A illustrates an exemplary embodiment of the process optimization module of the electrochemical plating system shown in FIG. 11. The process optimization module 1124A may have a plurality of input variables and a plurality of output variables. The input variables may include, for example, real time thickness profile, bath temperature, wafer height, acidity, head rotation, tilt angle, and anode condition. The output variables may include, for example, current set point, anode timing, anode segment control signal, thief current, head spacing. In one embodiment, the process optimization module 1124A may be a multi input multi output software model that uses a predictive algorithm which determines a plurality of output variables required to converge to a desired plating result according to a plurality of input variables.

Figure 12:
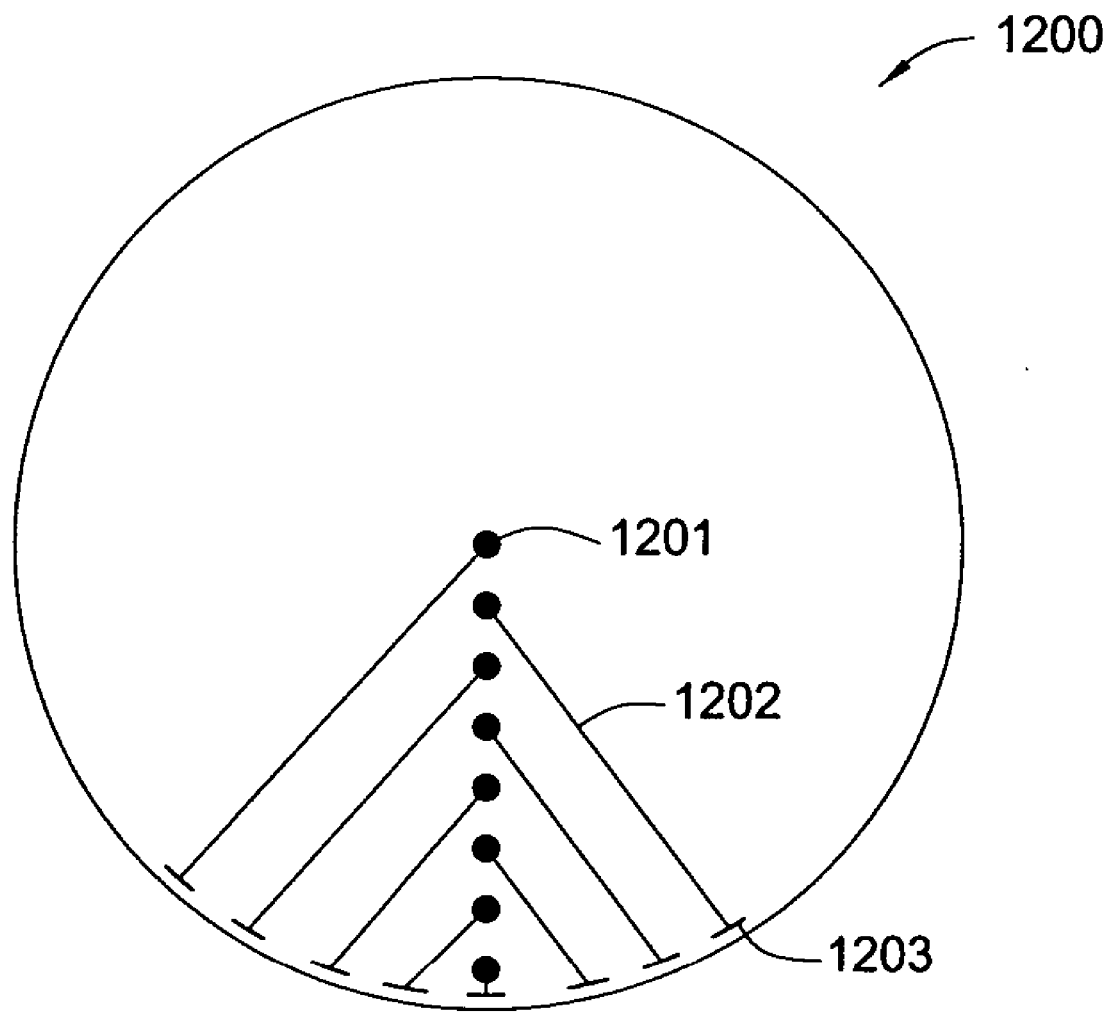
FIG. 12 illustrates an exemplary embodiment of a characterization tool of the present invention.

FIG. 12 illustrates an exemplary embodiment of a characterization tool 1200 of the present invention. The characterization tool 1200 is a special wafer that has metal patches 1201 at different radius of the wafer 1200. Each patch 1201 is connected to a connection point 1203 on a perimeter of the wafer 1200 by a metal trace 1202 on the wafer. The metal trace 1202 are covered by a dielectric material such that when the wafer 1200 is in contact with an electrolyte, the metal trace 1202 does not make contact with the electrolyte. In one aspect, the wafer 1200 may be disposed to be plated in an electroplating cell with the connection points 1203 aligned with contact pins on an contact ring of the electroplating cell. A current on each metal patch 1201 may be measured down stream from a corresponding contact ring. In one aspect, the current value measured from a contact ring can be compared with a current value measured by corresponding sensors of along the same radius. In one aspect, the sensors accuracy may be characterized. In another aspect, the comparison results may be used to calibrate and "correct" the sensor readings. The wafer 1200 may also be used to characterize a plating cell or an anode assembly. In one embodiment, the patches 1201, the trace 1202 and the connection point 1203 are made of copper. In one aspect, the patches 1201 may have a size of 2 $mm^2$. The patches 1201 and the connection points 1203 may be arranged in different ways.

Figure 13:
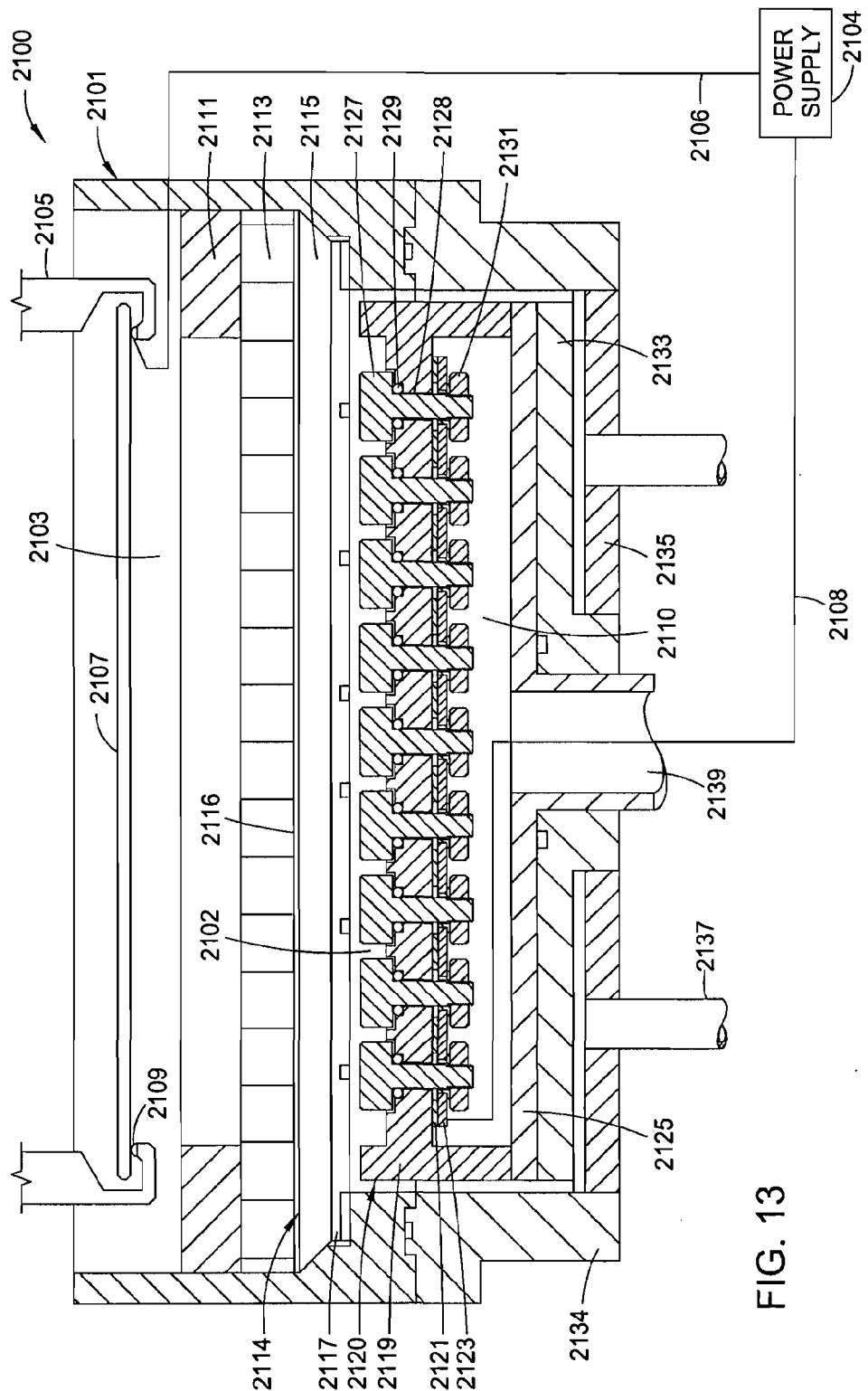
FIG. 13 illustrates a schematic sectional view of one embodiment of an electroplating cell.

FIG. 13 illustrates a schematic sectional view of an exemplary plating cell of the present invention. The electrochemical plating cell 2100 generally includes a basin assembly 2101 configured to contain a plating solution that is used to plate a metal, e.g., copper, onto a substrate 2107 during an electrochemical plating process. During the plating process, the plating solution is generally continuously supplied to the basin assembly 2101, and therefore, the plating solution continually overflows out of the basin assembly 2101 and is collected and drained for chemical management and/or recirculation.

The basin assembly 2101 generally includes basin walls 2134, a basin base 2135 and a base member 2133, configured to contain an electrolyte and direct a flow circulation for the electrolyte contained therein. The basin walls 2134 may define a cylindrical volume. The basin base 2135 is generally an annular disk attached to the basin walls 2134 near an end of the basin walls 2134. The basin base 2135 may have a central aperture and may have a plurality of fluid inlets/drains 2137 connected thereto and configured to individually supply or drain the fluid in the basin assembly 2101. The base member 2133 is generally disposed in the central aperture of the basin base 2135 and generally includes a disk shaped recess formed into a central portion configured to receive an anode assembly 2120. The base member 2133 may include trenches and slots which may form fluid conduits connected in fluid communication with the plurality of inlets/drains 2137. The anode assembly 2120 is generally disposed in the recess of the basin base 2133.

A membrane support assembly 2114 is generally disposed above the anode assembly 2120 in the basin assembly 2101. The basin assembly 2101 defines a volume which may be divided into an anolyte chamber 2102 and a catholyte chamber 2103 by a membrane 2116 stretched on top of the membrane support assembly 2114. A diffusion plate 2113 may be disposed above the membrane 2116 and a collimator 2111 may be disposed above the diffusion plate 2113. A contact ring 2105 having a plurality of contact pins 2109 is positioned near the top of the catholyte chamber 2103 and is vertically movable relative to the cell body 2101. The contact pins 2109, configured to apply a bias near the perimeter of a substrate 2107 to be plated, are in electrical communication with a first terminal 2106 of a power supply 2104. A second terminal 2108 of the power supply 2104 is in electrical communication with the anode assembly 2120. The power supply 2104 may be a single power source with multiple output channels or single power source with multiple switches or may be multiple power sources.

The membrane support assembly 2114 generally includes an interior region configured to allow fluids to pass therethrough and may comprise an upper support 2115 and a lower support 2117. The lower support 2117 generally secured at an outer periphery of the base member 2133 may be constructed by a series of parallel bars configured to support the upper support 2115 and the membrane 2116 and to direct the flow in the anolyte chamber 2102. The membrane 2116 is stretched across the upper support 2115 disposed on top of the lower support 2117. The membrane 2116 generally operates to fluidly separate the catholyte chamber 2103 (positioned adjacent the substrate 2107 being plated) and the anolyte chamber 2102 (positioned adjacent the anode assembly 2120). The upper support 2115 may include an o-ring type seal positioned near a perimeter of the membrane 2116, wherein the seal is configured to prevent fluids from traveling from one side of the membrane 2116 secured on the upper support 2115 to the other side of the membrane 2116. As such, membrane 2116 generally provides fluid isolation between the anolyte chamber 2102 and the catholyte chamber 2103 of the plating cell 2100, i.e., via use of a cationic membrane. Exemplary membranes that may be used to fluidly isolate an anolyte from a catholyte. Alternatively, membrane 2116 may be a fluid permeable, filter-type membrane that allows fluids to pass therethrough. In one embodiment, the electroplating cell 2100 may be a single chamber plating cell without the membrane assembly 2114.

The diffusion plate 2113, which is generally a ceramic or other porous disk shaped member or other fluid permeable electrically resistive member, generally operates as a fluid flow restrictor to even out the flow pattern across the surface of the substrate. Once the plating solution is introduced into the catholyte chamber 2103, the plating solution travels upward through the diffusion plate 2113. Further, the diffusion plate 2113 operates to resistively damp electrical variations in the electrochemically active area of the anode assembly 2120 or surface of the membrane 2116, which is known to reduce plating uniformities.

The collimator 2111 having an annular shape is generally disposed above the diffusion plate 2113 and below the contact ring 2105. The collimator generally 2111 has a diameter smaller than that of the substrate 2107 and is configured to constrain the electric field in the catholyte chamber 2103.

In one embodiment of the present invention, the anode assembly 2120 may include a plurality of anode elements 2127 which are arranged in the form of an array which can be biased independently. The anode elements 2127 are generally conductive metal plates which may be made of copper, titanium, platinum, platinum coated titanium, or any other metal or conductor. The anode elements 2127 have an anode surface and can be a variety of shapes, including the shape of a triangle, a rectangle, a square, a circle, or a hexagon and may be arranged in hexagonal, rectangular, square, and circular arrangements. Hexagonal arrangements may have particular advantages as described below.

In one aspect, an anode frame 2119 having a disk shape with a plurality of openings 2128 that define a pattern of an arrangement may be used to secure the arrangement of the anode elements 2127. In one embodiment, the anode element 2127 may have a rod extending from an opposite side of the anode surface. The rod being smaller in size than the anode plate enables each of the anode elements 2127 to be supported and held in place by one of the openings 2128. Each of the anode elements 2127 may further be secured by a nut 2131 from an opposite side of the anode frame 2119. A seal 2129 may be used in each of the openings 2128 to prevent the fluid in the anolyte chamber 2102 from leaking through the openings 2128. An anode base 2135 having a central aperture is attached to the anode frame 2119 near the perimeter of the anode frame 2119. The anode frame 2119 and the anode base 2125 may form a chamber 2110 configured to house the nuts 2131 and wirings to power the anode elements 2127. A printed circuit board 2123 with the same pattern of openings as the anode frame 2119 may be used to connect each of the anode elements 2127 to a respective power source in the power supply 2104. In one aspect, a foil 2121 having the same arrangement but larger openings may be used to detect leakage of the fluid in the anolyte chamber 2102. The anode base 2119, the foil 2121 and the printed circuit board 2123 are generally stacked together with their openings in alignment so that the anode elements are isolated from each other and are connected to the power supply 2104 independently.

In one aspect, the printed circuit board 2123 may have different designs to connect different anode elements 2127 in certain geometric patterns. For example, the anode elements 2127 may be divided into a plurality of zones by the printed circuit board 2123 and the anode elements 2127 in each zone may be biased by the same power source. In one aspect, each zone may be a discrete circle or a discrete ring formed by multiple anode elements 2127. This concentric ring arrangement is advantageous in implementing a symmetrical patterned bias with limited power sources without producing small rings of unbiased areas in a plating surface as do concentric anode rings. In one aspect, the zones may be a series of parallel strips formed by multiple anode elements. This stripped zone arrangement is advantageous in implementing non-symmetrical patterned bias particularly during an immersing process.

In one aspect, the printed circuit board 2123 may be used to mount power chips to control switching of individual anode element 2127. The power chips may be used to simplify requirements for the power supply 2104, or implement various bias patterns, or enables speedy switching functions.

In one embodiment, not shown, individual anode element 2127 may be connected to the power source 2104 by insulated wire conductors in stead of the printed circuit board 2123.

Figure 14:
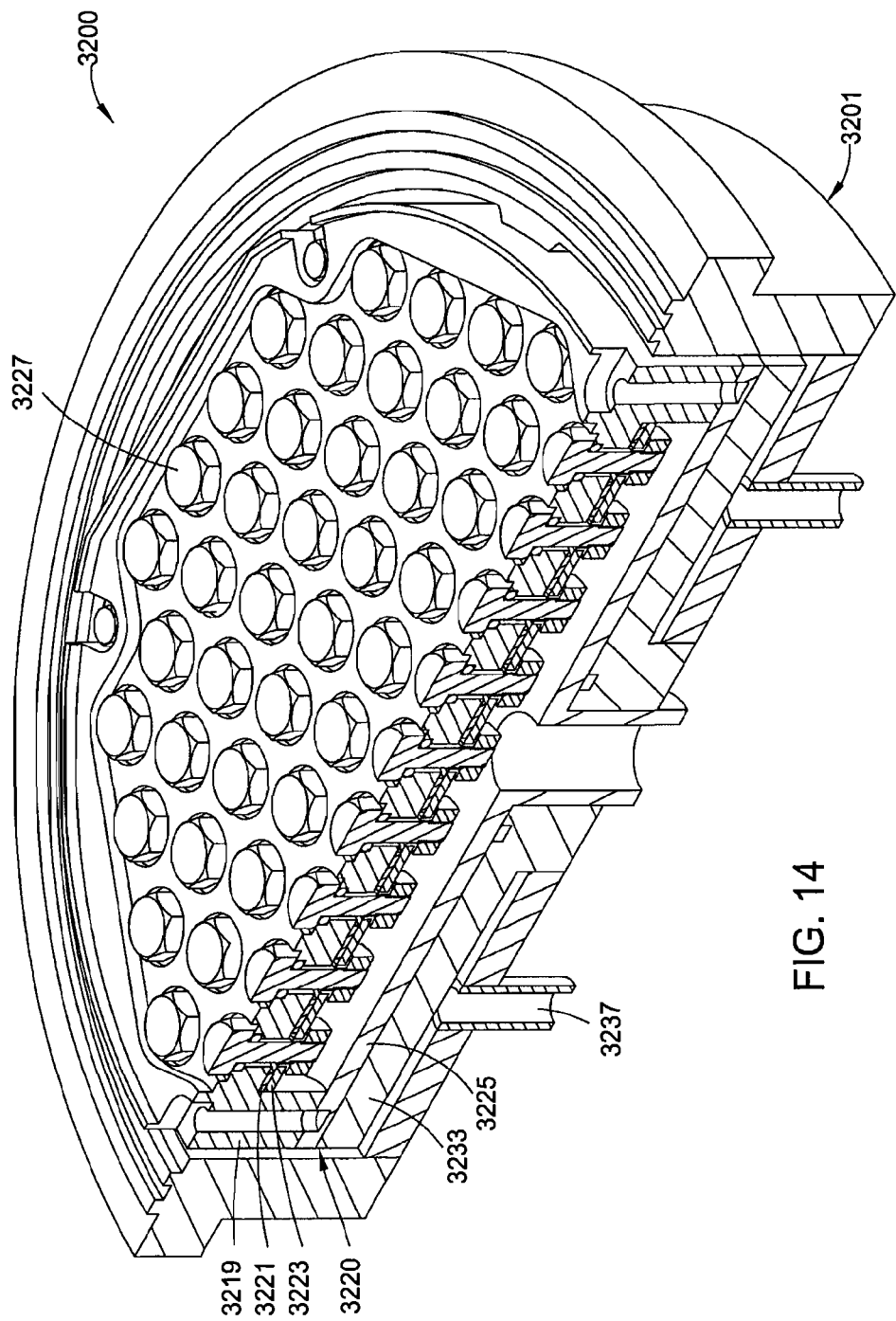
FIG. 14 illustrates a schematic sectional and partial perspective view of one embodiment of an electroplating cell.

FIG. 14 illustrates a schematic sectional and partial perspective view of one embodiment of an anode assembly 3220. Only the anode assembly 3220 and a partial basin assembly 3201 of an electrochemical plating cell are shown in FIG. 14. The anode assembly 3220 is generally disposed in the partial basin assembly 3201. An array of anode elements 3227 is generally disposed in an anode frame 3219. Each of the anode elements 3227 is secured to the stack of the anode frame 3219, a foil 3221, and a printed circuit board 3223 by a conductive nut 3233. In one embodiment, the anode elements 3227 have a shape of a bolt with a hexagonal head. The heads of the anode elements 3227 serve as individual anodes with a hexagonal plate. The anode elements 3227 are packed in a hexagonal arrangement. In one embodiment, the anode elements 3227 may be M12 bolts plated with platinum.

While the foregoing is directed to embodiments of the present invention, other and further embodiments of the invention may be devised without departing from the basic scope thereof, and the scope thereof is determined by the claims that follow.

What is claimed is:

1. A method for generating a real time thickness profile of a substrate during an electrochemical plating process conducted in an electrolyte, comprising:
measuring a set of currents using an array of sensors disposed in the electrolyte; each of the sensors of the array being positioned at a different geometric location with respect to the substrate, wherein measuring said set of currents comprises:
measuring a set of differential voltages using the array of sensors, each sensor being configured to measure a local voltage level in the electrolyte, and each differential voltage being measured by sensing local voltage levels of two or more sensors; and
calculating the set of currents from the set of differential voltages;
integrating the set of currents relative to a period of time to obtain a set of charge data;
correlating the set of charge data to values of plated thickness; and
generating the real time thickness profile from the values of plated thickness.

2. The method of claim 1, wherein the substrate has an original thickness profile and wherein the generating a real time thickness profile further comprises adding the values of plated thickness to the original thickness profile.

3. The method of claim 1, wherein each of the set of differential voltages comprises a first component of a first coordinate and a second component of a second coordinate.

4. The method of claim 3, wherein the first coordinate is horizontal and wherein the second coordinate is vertical.

5. The method of claim 3, wherein the calculating the set of currents comprises:
multiplying, for each of the set of differential voltages, the first component by a first coefficient; and
multiplying, for each of the set of differential voltages, the second component by a second coefficient.

6. The method of claim 5, wherein the substrate has an original thickness profile and wherein the generating a real time thickness profile further comprises adding the original thickness profile to the values of plated thickness.

7. The method of claim 1, wherein measuring a current comprises:
measuring a first differential voltage between a first sensor and a second sensor;
measuring a second differential voltage between the first sensor and a third sensor disposed in the electrolyte;
multiplying the first differential voltage by a first predetermined coefficient; and
multiplying the second differential voltage by a second predetermined coefficient.

8. The method of claim 7, wherein the substrate has an original thickness profile and wherein generating the real time thickness profile comprises adding the values of plated thickness to the original thickness profile.

9. The method of claim 7, wherein each of the first, second and third sensors comprises a metal wire floating in the electrolyte without connecting to any reference electrode.

10. The method of claim 1, wherein each sensor comprises a metal wire floating in the electrolyte without connecting to any reference electrode.

11. The method of claim 1, wherein the array of sensors comprises a plurality of sensors distributed across a radius of a plating surface.

12. The method of claim 11, wherein the array of sensors are positioned between about 1 mm to about 15 mm away from the plating surface.

13. The method of claim 1, further comprising adjusting bias of each anode element in an anode assembly independently according to the real time thickness profile.

14. The method of claim 13, wherein the anode assembly comprises a plurality of anode elements packed in a hexagonal arrangement.

15. A method of producing a uniform profile on a substrate by electrochemical plating, comprising:
starting an electroplating process on the substrate, wherein the substrate is in contact with an electrolyte;
generating a real time thickness profile comprising:
measuring a set of currents in the electrolyte using an array of sensors disposed in the electrolyte, each of the sensors of the array being positioned at a different geometric location with respect to the substrate, wherein measuring said set of currents comprises:
measuring a set of differential voltages using the array of sensors, each sensor being configured to measure a local voltage level in the electrolyte, and each differential voltage being measured by sensing local voltage levels of two or more sensors; and
calculating the set of currents from the set of differential voltages,
integrating the set of currents relative to a period of time to obtain a set of charge data;
correlating the set of charge data to values of plated thickness; and
generating the real time thickness profile from the values of plated thickness; and
adjusting one or more process parameters according to the real time thickness profile.

16. The method of claim 15, wherein the one or more processing parameters comprises at least current set point.

17. The method of claim 15, wherein the adjusting one or more processing parameters comprises adjusting local current set point corresponding to local thickness reflected in the real time thickness profile.

18. The method of claim 15, wherein the adjusting one or more processing parameters comprises using a predictive algorithm to determine the adjustment of the one or more processing parameters.

19. The method of claim 15, wherein each sensor comprises a metal wire floating in the electrolyte without connecting to any reference electrode.

20. The method of claim 15, wherein the array of sensors comprises a plurality of sensors distributed across a radius of a plating surface.

21. The method of claim 20, wherein the array of sensors are positioned between about 1 mm to about 15 mm away from the plating surface.

22. The method of claim 15, further wherein adjusting one or more process parameters comprises adjusting bias of each anode element in an anode assembly independently according to the real time thickness profile.

23. The method of claim 22, wherein the anode assembly comprises a plurality of anode elements packed in a hexagonal arrangement.

24. A method of producing a desired thickness profile on a substrate by electrochemical plating, comprising:
  starting an electroplating process on the substrate, wherein the substrate is in contact with an electrolyte;
  generating a real time thickness profile comprising:
    measuring a set of currents in the electrolyte using an array of sensors disposed in the electrolyte, each of the sensors of the array being positioned at a different geometric location with respect to the substrate, wherein measuring said set of currents comprises:
      measuring a set of differential voltages using the array of sensors, each sensor being configured to measure a local voltage level in the electrolyte, and each differential voltage being measured by sensing local voltage levels of two or more sensors, and
      calculating the set of currents from the set of differential voltages,
    integrating the set of currents relative to a period of time to obtain a set of charge data; and
    correlating the set of charge data to values of plated thickness;
    generating the real time thickness profile from the values of plated thickness; and
  comparing the real time thickness profile to the desired thickness profile to obtain an error profile;
  adjusting one or more process parameters according to the error profile; and
  terminating the electroplating process when the error profile is within a predetermined tolerance profile.

25. The method of claim 24, wherein the one or more processing parameter comprises at least current set point.

26. The method of claim 24, wherein the adjusting one or more processing parameters comprises adjusting local current set point corresponding to local thickness reflected in the real time thickness profile.

27. The method of claim 26, wherein the adjusting local current set point comprises adjusting bias of each anode element in an anode assembly independently according to the real time thickness profile.

28. The method of claim 27, wherein the anode assembly comprises a plurality of anode elements packed in a hexagonal arrangement.

29. The method of claim 24, wherein the adjusting one or more processing parameters comprises using a predictive algorithm to determine an adjustment of the one or more processing parameters.

30. The method of claim 24, wherein each sensor comprises a metal wire floating in the electrolyte without connecting to any reference electrode.

31. The method of claim 24, wherein the array of sensors comprises a plurality of sensors distributed across a radius of a plating surface.

* * * * *

UNITED STATES PATENT AND TRADEMARK OFFICE
CERTIFICATE OF CORRECTION

PATENT NO. : 7,837,851 B2  
APPLICATION NO. : 11/137711  
DATED : November 23, 2010  
INVENTOR(S) : Birang et al.

Page 1 of 1

It is certified that error appears in the above-identified patent and that said Letters Patent is hereby corrected as shown below:

Column 10, Line 5, please delete " $\Sigma dV = \sqrt{(C_1 dVh)^2 + (C_2 dVn)^{26}}$ " and insert -- $\Sigma dV = \sqrt{(C_1 dVh)^2 + (C_2 dVn)^2}$ -- therefor.

Signed and Sealed this  
First Day of March, 2011

David J. Kappos  
*Director of the United States Patent and Trademark Office*